(12) United States Patent
Wu et al.

(10) Patent No.: US 11,831,319 B2
(45) Date of Patent: Nov. 28, 2023

(54) READOUT CIRCUIT, OFFSET VOLTAGE ELIMINATING METHOD, COMPUTER DEVICE, AND STORAGE MEDIUM

(71) Applicant: Shanghai United Imaging Microelectronics Technology Co., Ltd., Shanghai (CN)

(72) Inventors: Rong Wu, Irvine, CA (US); Wenliang Ren, Shanghai (CN); Yin Tang, Shanghai (CN)

(73) Assignee: Shanghai United Imaging MicroElectronics Technology Co., Ltd., Shanghai (CN)

( * ) Notice: Subject to any disclaimer, the term of this patent is extended or adjusted under 35 U.S.C. 154(b) by 0 days.

(21) Appl. No.: 17/714,520

(22) Filed: Apr. 6, 2022

(65) Prior Publication Data

US 2022/0231675 A1 Jul. 21, 2022

(51) Int. Cl.
| | |
|---|---|
| *H03M 1/10* | (2006.01) |
| *H03K 5/02* | (2006.01) |
| *H03K 5/24* | (2006.01) |
| *H03M 3/00* | (2006.01) |
| *H03K 17/16* | (2006.01) |

(52) U.S. Cl.
CPC .............. *H03K 5/02* (2013.01); *H03K 5/24* (2013.01); *H03M 1/1009* (2013.01); *H03M 3/30* (2013.01); *H03K 17/16* (2013.01)

(58) Field of Classification Search
CPC ............ H03K 5/02; H03K 5/24; H03K 17/16; H03M 1/1009; H03M 3/30
See application file for complete search history.

(56) References Cited

U.S. PATENT DOCUMENTS 7,479,800 B1 * 1/2009 Vullaganti ....... H03K 19/00369
326/21

* cited by examiner

*Primary Examiner* — Joseph J Lauture
(74) *Attorney, Agent, or Firm* — Polsinelli PC

(57) ABSTRACT

Disclosed are a readout circuit, an offset voltage eliminating method and device, a computer device, and a non-transitory computer-readable storage medium. The readout circuit includes an object quantizer and an offset voltage elimination circuit. The offset voltage elimination circuit includes a correction circuit and a calibration circuit, an input of the correction circuit is connected to an output of the object quantizer, a compensation input of the calibration circuit is connected to an output of the current compensator, and a reference input of the calibration circuit is connected to the output of the object quantizer.

15 Claims, 10 Drawing Sheets

READOUT CIRCUIT, OFFSET VOLTAGE ELIMINATING METHOD, COMPUTER DEVICE, AND STORAGE MEDIUM

TECHNICAL FIELD

The present disclosure relates to the field of electronics technology, and more particularly to a readout circuit, an offset voltage eliminating method, a computer device, a non-transitory computer-readable storage medium.

BACKGROUND

The readout circuit can pre-process an analog signal sampled by a signal sampler and convert a signal to generate a current signal.

The device performing the signal conversion in the readout circuit is a quantizer, and the noise level of the quantizer is very important, and determines the noise level of the entire readout circuit system. For example, the offset voltage of the quantizer may cause the inaccurate reference voltage of the quantizer. Based on this, in order to meet a low noise requirement of the readout circuit system, it is necessary to perform an offset voltage elimination on the reference voltage of the quantizer.

Therefore, how to cancel the offset voltage in the reference voltage of the quantizer has become an urgent technical problem to be solved.

SUMMARY

Embodiments according to the present disclosure provide a readout circuit, an offset voltage eliminating method, a computer device, and a non-transitory computer-readable storage medium, which are capable of eliminating the offset voltage in the reference voltage of the quantizer.

In a first aspect, an embodiment of the present disclosure provides a readout circuit including an object quantizer and an offset voltage elimination circuit. The offset voltage elimination circuit includes a correction circuit, an input of the correction circuit being connected to an output of the object quantizer, and a calibration circuit, a compensation input of the calibration circuit being connected to an output of the correction circuit, and a reference input of the calibration circuit is connected to the output of the object quantizer.

In one of the embodiments, the readout circuit further includes an offset voltage generating device. A reference input of the offset voltage generating device is connected to a reference voltage terminal, and an output of the offset voltage generating device is connected to an input of the object quantizer.

In one of the embodiments, the offset voltage generating device includes the offset voltage generating device including an amplifier and a buffer. An input of the buffer is connected to the reference voltage terminal, an output of the buffer is connected to an input of the amplifier, and an output of the amplifier is connected to the input of the object quantizer.

In one of the embodiments, the above correction circuit may include a comparator, an analog-to-digital converter, and a current compensator. The comparator is configured to process a voltage signal converted from the offset voltage to obtain a level signal, an input of the analog-to-digital converter is connected to an output of the comparator, and an output of the analog-to-digital converter is connected to an input of the current compensator. An output of the current compensator is connected to the compensation input of the calibration circuit.

In one of the embodiments, an output of the calibration circuit is connected to the offset voltage generating device.

In one of the embodiments, the analog-to-digital converter may include a first analog-to-digital converter and a second analog-to-digital converter, and the current compensator may include a first current compensator and a second current compensator. The compensation input of the calibration circuit includes a first input and a second input, and the output of the calibration circuit includes a first output and a second output. The output of the comparator may be connected to an input of the first analog-to-digital converter, an output of the first analog-to-digital converter may be connected to an input of the first current compensator, and an output of the first current compensator may be connected to the first input of the calibration circuit, and the first output of the calibration circuit is connected to an input of the buffer. The output of the comparator may be connected to an input of the second analog-to-digital converter, and an output of the second analog-to-digital converter may be connected to an input of the second current compensator, and an output of the second current compensator may be connected to the second input of the calibration circuit, and the second output of the calibration circuit is connected to an input of the amplifier.

In one of the embodiments, the correction circuit may further include a first phase switch and a second phase switch. The comparator and the first analog-to-digital converter may be connected by the first phase switch, and the comparator and the second analog-to-digital converter may be connected by the second phase switch.

In one of the embodiments, the above correction circuit may further include a bidirectional offset voltage control circuit. An input of the bidirectional offset voltage control circuit is connected to the output of the current compensator, and an output of the bidirectional offset voltage control circuit is connected to the compensation input of the calibration circuit.

In one of the embodiments, the current compensator is configured to provide compensation currents for the buffer and the amplifier, respectively, and the bidirectional offset voltage control circuit is configured to control the compensation currents to flow to the buffer and to the amplifier at different phases.

In one of the embodiments, the correction circuit further includes a bidirectional offset voltage control circuit, and the bidirectional offset voltage control circuit may include a first bidirectional offset voltage control circuit and a second bidirectional offset voltage control circuit. An input of the first bidirectional offset voltage control circuit may be connected to the output of the first current compensator, an output of the first bidirectional offset voltage control circuit may be connected to the first input of the calibration circuit, and an input of the second bidirectional offset voltage control circuit may be connected to the output of the second current compensator, and an output of the second bidirectional offset voltage control circuit may be connected to the second input of the calibration circuit.

In one of the embodiments, the above calibration circuit may include a first phase calibration circuit and a second phase calibration circuit, and the first phase calibration circuit and the second phase calibration are configured to adjust and calibrate offset voltages at different phases, respectively.

In one of the embodiments, the above first phase calibration circuit may include a first voltage-current converter, and the second phase calibration circuit may include a second voltage-current converter. The amplifier may be configured to, at a first phase, convert an offset voltage generated by the buffer into a first offset current, or configured to, at a second phase, make the input of the amplifier short-circuit and convert an offset voltage generated by the amplifier into a second offset current. The object quantizer may be configured to integrate the first offset current to obtain a corresponding first voltage signal, or to integrate the second offset current to obtain a corresponding second voltage signal, the first voltage-current converter may be configured to generate a first fine-adjustment compensation current according to the first voltage signal, and the first fine-adjustment compensation current is configured to compensate for the buffer. The second voltage-current converter may be configured to generate a second fine-adjustment compensation current according to the second voltage signal, and the second fine-adjustment compensation current is configured to compensate for the amplifier.

In one of the embodiments, an input of the first voltage-current converter may be connected to the output of the object quantizer, an output of the first voltage-current converter may be connected with the buffer. An input of the second voltage-current converter may be connected to the output of the object quantizer, and an output of the second voltage-current converter may be connected to the amplifier.

In a second aspect, embodiments of the present disclosure provide a readout circuit including a coarse quantizer, a sample and hold circuit, a fine quantizer and an offset voltage elimination circuit. The coarse quantizer may be configured to coarsely quantize an analog signal of an object apparatus to obtain a first quantized signal, a reference voltage of the coarse quantizer is a voltage obtained by the offset voltage elimination circuit conducting an offset voltage elimination processing, and the offset voltage elimination process includes preliminarily correcting the offset voltage in the reference voltage of the coarse quantizer to stabilize a corrected offset voltage within a preset offset grade, and finely adjusting and calibrating the corrected offset voltage. A sample-and-hold circuit may be configured to conduct a sample-and-hold processing on the first quantized signal, and the fine quantizer may be configured to finely quantize a sampled and held first quantized signal to obtain a quantized value corresponding to the analog signal.

In one of the embodiments, the coarse quantizer may be an integrator, and the fine quantizer may be an analog-to-digital converter.

In one of the embodiments, the readout circuit includes a plurality of coarse quantizers, and the plurality of coarse quantizers correspond to one fine quantizer.

In a third aspect, an embodiment of the present disclosure provides a processor, which may include the readout circuit of any one of the embodiments above.

In a fourth aspect, embodiments of the present disclosure provide an offset voltage eliminating method, which may include steps of: performing a preliminary correction on an offset voltage in a reference voltage of an object quantizer to stabilize a corrected offset voltage within a preset offset grade; and performing a fine-adjustment calibration on the corrected offset voltage to eliminate the offset voltage to obtain a precise reference voltage of the object quantizer.

In a fifth aspect, embodiments according to the present disclosure provide an offset voltage elimination device, which may include a coarse-adjustment module configured to conduct a preliminary correction on an offset voltage in a reference voltage of an object quantizer to stabilize the corrected offset voltage within a preset offset grade, and include a fine-adjustment module configured to conduct a fine-adjustment calibration on the corrected offset voltage to eliminate the offset voltage to obtain a precise reference voltage of the object quantizer.

In a sixth aspect, an embodiment of the present disclosure provides a computer device including a memory, and a processor. The computer program is stored in the memory, and when executing the computer program, the processor performs the steps in the offset voltage eliminating method above.

In a seventh aspect, embodiments of the present disclosure provide a non-transitory computer-readable storage medium having a computer program stored thereon, wherein when executed by a processor, the computer program performs steps in the offset voltage eliminating method above.

The embodiments according to the present disclosure provide the readout circuit, the offset voltage eliminating method, the offset voltage elimination device, the computer device, and the computer-readable storage medium. The preliminary correction of the offset voltage in the reference voltage of the object quantizer is performed by the correction circuit so that the corrected offset voltage is stabilized within the preset offset grade, and then the fine-adjustment calibration is performed on the corrected offset voltage by the calibration circuit so as to eliminate the offset voltage and obtain the precise reference voltage of the object quantizer. In this way, through the offset calibration of two processes, on the one hand, a rapid correction is performed in the case of a relatively large offset amplitude, so that the offset is corrected to be within a relatively small offset grade. On the other hand, the fine-adjustment calibration is performed on the remaining offset, so that the offset voltage may be eliminated from the reference voltage of the quantizer, thereby ensuring that the reference voltage source of the quantizer to be more precise. Moreover, only such a calibration circuit requiring two-step sampling and calibrating process is provided, which makes the circuit design simpler, thereby saving the chip area, and reducing the power consumption.

BRIEF DESCRIPTION OF THE DRAWINGS

In order to more clearly illustrate the technical solutions in the embodiments of the present disclosure or in the related art, the accompanying drawings to be used in the description of the embodiment or of the related art will be briefly introduced below. It is apparent that the accompanying drawings in the following description are merely some of the embodiments of the present disclosure, and other drawings may be obtained from these drawings by those ordinary skilled in the art without any creative effort.

Figure 1:
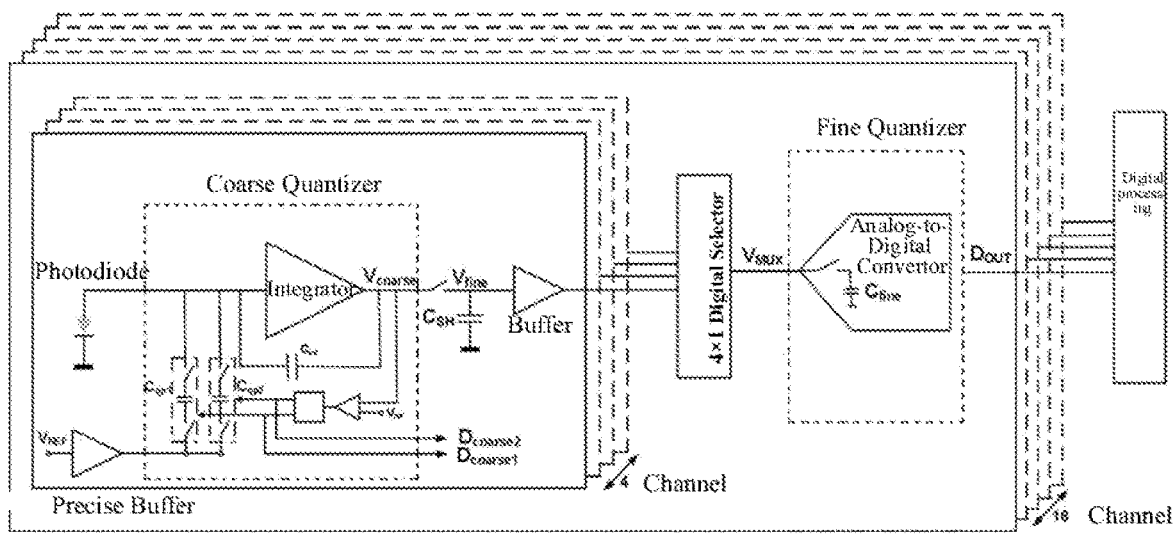
FIG. 1 is a schematic circuit principle diagram illustrating a readout circuit according to an embodiment of the present disclosure.

Reference numerals are illustrated as below:

10. offset voltage elimination circuit; 20. readout circuit; 101. correction circuit; 102. calibration circuit; 103. object quantizer; 104. offset voltage generating device; 1011. comparator; 1012. analog-to-digital converter; 1013. current compensator; 1014. bidirectional offset voltage control circuit; 1015. first correction module; 1016 second correction module; 10151. first analog-to-digital converter; 10152. first current compensator; 10153. first bidirectional offset voltage control circuit; 10154. first phase switch; 10161. second analog-to-digital converter; 10162. second current compensator; 10163. second bidirectional offset voltage control circuit; 10164. second phase switch; 1021. first phase calibration circuit; 1022. second phase calibration circuit; 10211. first voltage-current converter; 10221. second voltage-current converter; 1041. buffer; 1042. amplifier; 201. coarse quantizer; 202. sample-and-hold circuit; 203. fine quantizer; 30. offset voltage elimination device; 301. coarse-adjustment module; 302. fine-adjustment module.

DETAILED DESCRIPTION

The technical solutions of embodiments according to the present disclosure will be clearly and completely described below in combination with the accompanying drawings of the present disclosure. It will be apparent that the described embodiments are only a part of the embodiments of the present disclosure, rather than all of the embodiments. Based on the embodiments of the present disclosure, all other embodiments obtained by those skilled in the art without creative work also fall within the protection scope the present disclosure.

Unless otherwise defined, all technical and scientific terms used herein have the same meanings as those understood by those skilled in the art that belongs to the technical field of the embodiments of the present disclosure. The terms in the specification of the present disclosure are only used to describe specific embodiments but not intended to limit the embodiments of the present disclosure.

It will be understood that the terms "first", "second" and the like used in the embodiments of the present disclosure may be used herein to describe various elements, but these elements are not limited by these terms. These terms are used only to distinguish one element from another element. For example, without departing from the scopes of the embodiments of the present disclosure, a first resistor may be named as a second resistor, and similarly, the second resistor may be named as the first resistor. Both the first resistor and the second resistor are resistors, but they are not the same resistor. It will also be understood that "connection" in the following embodiment should be understood as "electrical connection" or "communication connection", etc. If there are electric signal transmissions or data transmissions among connected circuits, modules, units, or the like.

As used herein, "a", "an" and "the/said" in the singular forms may include the plural forms thereof as well, unless the context clearly dictates otherwise. It should also be understood that the terms "comprising/including" or "having" etc., designate the presence of stated features, integers, steps, operations, components, parts, or combinations thereof, but do not exclude possibilities of the presence or addition of one or more other features, integers, steps, operations, components, parts or combinations thereof. It should also be understood that the terminologies used in the present disclosure are only used for describing specific embodiments, and are not intended to limit the present disclosure. It should further be understood that, the term "and/or", used in the present disclosure and claims, refers to and includes any of and all possible combinations of one or more of the associated listed items.

In addition, in the schematic block diagram in the present disclosure, arrows indicate the relationships between the signals, specifically, the arrow directing a block represents the input of the block, and the arrow leaving block represents the output of the block.

As shown in FIG. 1, a schematic circuit principle diagram illustrating a readout circuit is provided. Specifically, the readout circuit is a CT detector, a Positron Emission Tomography (PET) detector, or other similar detector, or a readout circuit for any other purpose. Taking an application-specific integrated readout circuit for the CT detector as an example, in practical applications, in order to improve the quantization accuracy of the analog signal in a relatively short time, in the application-specific integrated readout circuit for the CT detector, a coarse quantization is realized for the photoelectric analog signal, collected by the photodiode, by a coarse quantizer first, and then the remaining signal is sent to a fine quantizer for fine quantization. In the readout circuit, the coarse quantizer includes a front-end integrator, and a fine quantizer includes a back-end analog-to-digital converter. In applications, both the coarse quantizer and the fine quantizer require a reference voltage source. However, in practical applications, reference voltage sources of the coarse quantizer and of the fine quantizer include some noise. For example, there is offset noise and flicker noise in the coarse quantizer, while the noise in the coarse quantizer determines the noise level of the entire system. Therefore, it is necessary to eliminate the noise in the coarse quantizer to enable the readout circuit to realize the photocurrent readout with low noise and high accuracy. In contrast, the noise in the fine quantizer is relatively nondominant in the whole system, and the reference voltage source of the fine quantizer may tolerate some noise, therefore the noise may be eliminated directly by a system-level consistent gain calibration algorithm, without additional denoising.

In the related art, techniques, and methods for the precision reference voltage source of the readout circuit for a low-noise and high-precision photocurrent mainly have the following problems to be solved:

1. Taking the twenty-bit accuracy as an example, for the readout circuit for the low-noise and high-precision twenty-bit photocurrent, in order to meet the requirement greater than twenty-bit accuracy in a time as short as possible, the readout circuit for the high-precision photocurrent mostly employs the method of integrating the current, then coarsely quantizing the current in a charge domain, and then finely quantizing the current. In this case, if both reference voltage sources for the coarse quantizing and for the finely quantizing are required to have high accuracy, low noise, and low mismatch, it is necessary to design a circuit having extremely large power consumption and a quite complex structure.

2. In order to achieve the above-mentioned high accuracy, in some cases, the high accuracy may be achieved without a circuit, but by manual trimming. However, there are quite a lot of chips on the Computed Tomography (CT) module in actual applications, and if the reference voltage for coarse adjustment in each chip requires trimming, the test time of the Automatic Test Equipment for the Integrated Circuit will be greatly increased, thereby increasing the chip cost. Furthermore, the trimming is a one-off calibration, which makes it difficult to restrain deviations caused by process-voltage-temperature factors such as a process, a temperature, etc. Therefore, the manual trimming will result in a long test time, an increase in chip cost, and poor calibration accuracy per se.

Given this, in the related art, there are some deficiencies in the design of the reference voltage source of the quantizer. For example, there are defects such as the large power consumption, the complicated circuit design, the high cost of manual trimming, and disability of restraining deviation caused by factors such as the process and the temperature well. Based on this, embodiments of the present disclosure provide an offset voltage elimination circuit, a readout circuit, an offset voltage eliminating method, an offset voltage elimination device, a computer apparatus, and a non-transitory computer-readable storage medium, which can cancel offset voltage in the reference voltage of the quantizer and ensure a more precise reference voltage source of the quantizer. It should be noted that the offset voltage elimination circuit, the readout circuit, the offset voltage eliminating method, the offset voltage elimination device, the computer apparatus, and the non-transitory computer-readable storage medium provided by the embodiments of the present disclosure are not limited to the above technical effects, but may achieve other technical effects. For example, the offset voltage elimination circuit, the readout circuit, the offset voltage eliminating method, the offset voltage elimination device, the computer apparatus, and the non-transitory computer-readable storage medium provided by the embodiments of the present disclosure only is provided with only a calibration circuit requiring two-step sampling and calibrating process, which makes the circuit design simpler, thereby saving the chip area, and reducing the power consumption.

Figure 2:
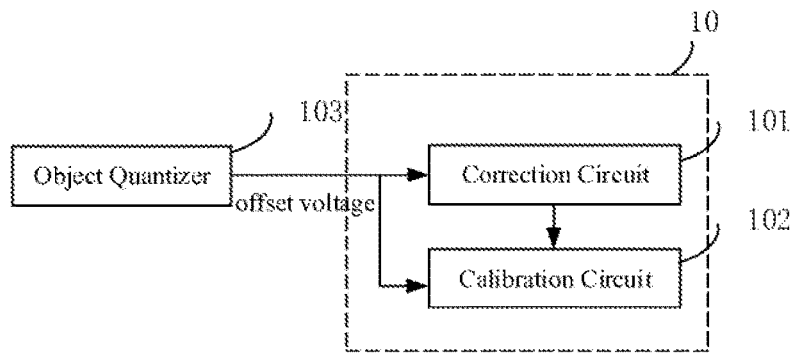
FIG. 2 is a schematic block diagram illustrating the readout circuit according to an embodiment of the present disclosure.

Referring to FIG. 2, an embodiment of the present disclosure provides a readout circuit. The readout circuit includes an object quantizer 103 and an offset voltage elimination circuit 10 including a correction circuit 101 and a calibration circuit 102. The correction circuit 101 is configured to preliminarily correct an offset voltage in a reference voltage of an object quantizer 103 to stabilize the corrected offset voltage within a preset offset grade. The calibration circuit 102 is configured to finely adjust and calibrate the corrected offset voltage, to eliminate the offset voltage and to obtain a precise reference voltage of the object quantizer 103.

In practical applications, the object quantizer may be a coarse quantizer in the readout circuit, for example, the coarse quantizer may include a front-end integrator or an analog-to-digital converter of the readout circuit.

Generally, the offset voltage in the reference voltage of the coarse quantizer belongs to one of the inherent noises of the semiconductor and is caused by a large manufacturing process deviation of elements and/or devices connected to a reference voltage terminal of the object quantizer. For this, the offset voltage in the reference voltage of the coarse quantizer may be eliminated by the offset voltage elimination circuit 10 provided in the embodiments of the present disclosure.

Figure 3:
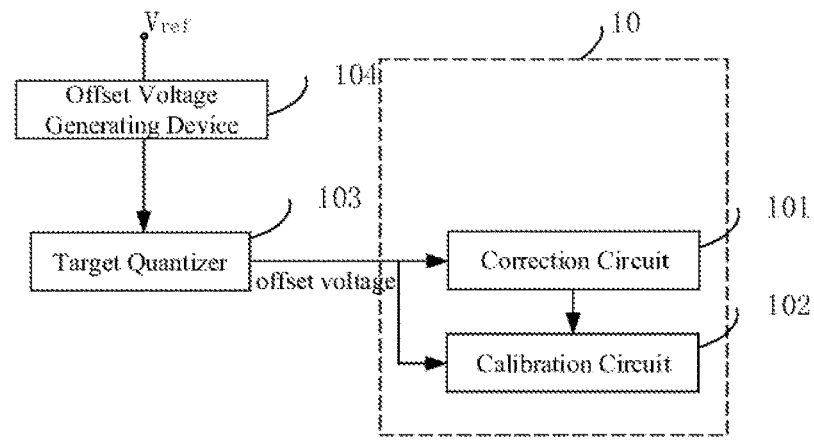
FIG. 3 is a schematic block diagram illustrating the readout circuit according to another embodiment of the present disclosure.

In an embodiment, as shown in FIG. 3, the embodiment of the present disclosure further provides a readout circuit, the readout circuit includes an offset voltage elimination circuit 10 including the correction circuit 101 and the calibration circuit 102, an offset voltage generating device 104, and the object quantizer 103. An input of the offset voltage generating device 104 is connected to a reference voltage terminal, an output of the offset voltage generating device 104 is connected to an input of the object quantizer 103, and an output of the object quantizer 103 is connected to an input of the calibration circuit 102 and a reference input of the correction circuit 101, respectively.

The offset voltage generating device 104 is a device connected to a reference voltage terminal of the object quantizer 103. FIG. 3 is a schematic diagram illustrating the connection of the offset voltage generating device 104 in readout circuit. The input of the offset voltage generating device 104 is the reference voltage terminal Vref of the object quantizer 103, and the output of the offset voltage generating device 104 is connected to the input of the object quantizer 103, and the output of the object quantizer 103 is connected to the correction circuit 101 and the calibration circuit 102.

In FIG. 2, the reference voltage of the object quantizer 103 is a voltage outputted from the reference voltage terminal Vref and is applied to the offset voltage generating device 104 then to the object quantizer 103, thereafter an offset voltage generated by the offset voltage generating device 104 is carried by the reference voltage of the object quantizer 103 and enters the correction circuit 101 and the calibration circuit 102. The correction circuit 101 performs a preliminary correction on the offset voltage, and the corrected offset voltage is stabilized within a preset offset grade. This preliminary correction process is equivalent to a rapid correction process, that is, a rapid correction is performed in a case that the offset amplitude is large, to correct the offset voltage to be within a small offset grade. Then, the calibration circuit 102 will perform a fine-adjustment on the corrected offset voltage, so as to eliminate the offset voltage of the offset voltage generating device 104. For example, after the offset voltage is eliminated, the reference voltage may reach twenty-bit accuracy.

Thus, the input of the offset voltage generating device 104 is the reference voltage terminal, the output of the offset voltage generating device 104 is connected to the input of the object quantizer 103, and the output of the object quantizer 103 is connected to the reference input of the calibration circuit 102 and the input of the correction circuit 101, respectively. In this way, after the offset voltage generated by the offset voltage generating device 104 enters the correction circuit 101 and the calibration circuit 102, the correction circuit 101 performs the preliminary correction on the offset voltage in the reference voltage of the object quantizer 103, so that the corrected offset voltage is stabilized within the preset offset grade. Moreover, the calibration circuit 102 performs the fine-adjustment calibration on the corrected offset voltage, so that the offset voltage may be eliminated and the precise reference voltage of the object quantizer 103 is obtained. Accordingly, only such a calibration circuit requiring two-step sampling and calibrating process is provided, which makes the circuit design simpler, thereby saving the chip area, and reducing the power consumption.

Further, the offset voltage elimination circuit 10 provided in the embodiment of the present disclosure performs the preliminary correction of the offset voltage on the reference voltage of the object quantizer 103 by the correction circuit 101, so that the corrected offset voltage is stabilized within the preset offset grade, and then the fine-adjustment calibration is performed on the corrected offset voltage by the calibration circuit 102, so as to eliminate the offset voltage and obtain the precise reference voltage of the object quantizer 103. In this way, through the offset calibration of two processes, on the one hand, a rapid correction is performed in the case of a relatively large offset amplitude, so that the offset is corrected to be within a relatively small offset grade. On the other hand, the fine-adjustment calibration is performed on the remaining offset, so that the offset voltage may be eliminated from the reference voltage of the quantizer, thereby ensuring that the reference voltage source of the quantizer to be more precise. Moreover, only such a calibration circuit requiring two-step sampling and calibrating process is provided, which makes the circuit design simpler, thereby saving the chip area, and reducing the power consumption.

Based on the above embodiments, in an embodiment, the offset voltage generating device 104 includes a buffer 1041 and/or an amplifier 1042.

Figure 4:
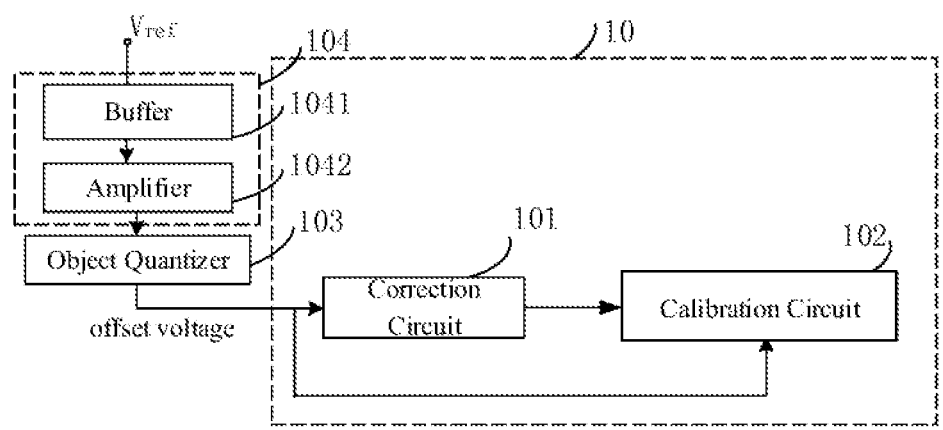
FIG. 4 is a schematic block diagram illustrating the readout circuit according to another embodiment of the present disclosure.

As shown in FIG. 4, an input of the buffer 1041 is the reference voltage terminal Vref, and an output of the buffer 1041 is connected to an input of the amplifier 1042. An output of the amplifier 1042 is connected to the input of the object quantizer 103.

When the reference voltage output from the reference voltage terminal Vref is applied to the buffer 1041 and the amplifier 1042, the buffer 1041 and the amplifier 1042 generate the offset voltage which is carried in the reference voltage, so that the offset voltage is carried in a final reference voltage of the object quantizer 103.

In practical applications, the buffer 1041 may ensure a synchronous transmission of data or clock, and the amplifier may realize the effect of amplifying the signal. The implementation structures of the buffer and the amplifier are not limited in the present disclosure and may be designed according to actual requirements.

Both the buffer 1041 and the amplifier 1042 generate offset voltages, and the offset voltages generated by the buffer 1041 and the amplifier 1042 may be eliminated at different phases. For example, the offset voltage generated by the buffer 1041 is eliminated at a first phase ph1, and the offset voltage generated by the amplifier 1042 is eliminated at the second phase ph2, and the first phase ph1 and the second phase ph2 may be implemented by a switching device.

Based on the above embodiments, the correction circuit 101 and the calibration circuit 102 in the offset voltage elimination circuit 10 are described herein.

In an embodiment, the correction circuit 101 may include an analog-to-digital converter and a current compensator.

Figure 5:
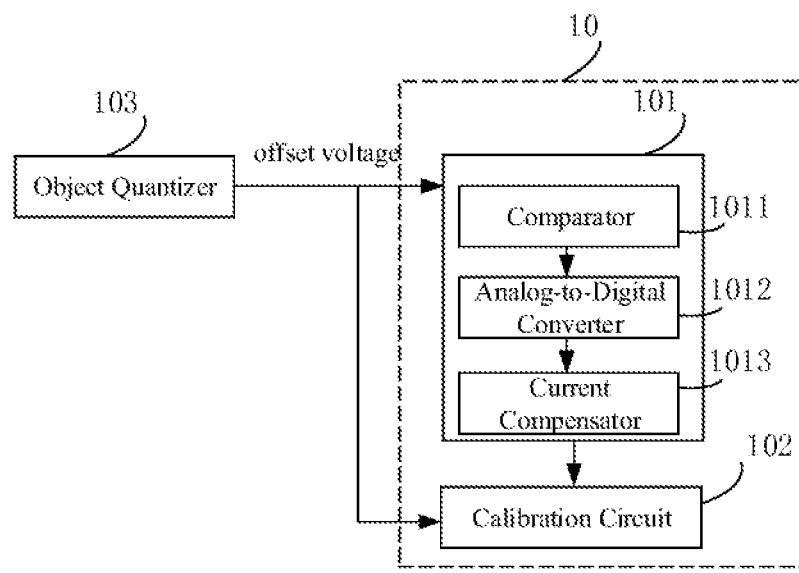
FIG. 5 is a schematic block diagram illustrating the readout circuit according to another embodiment of the present disclosure.

As shown in FIG. 5, the present disclosure provides the readout including the offset voltage elimination circuit 10. The correction circuit 101 in the offset voltage elimination circuit 10 includes a comparator 1011, the analog-to-digital converter 1012, and the current compensator 1013. The comparator 1011 is configure to a voltage signal converted from the offset voltage to obtain a level signal. The analog-to-digital converter 1012 is configured to generate a control signal according to the level signal and control, by means of the control signal, the current compensator 1013 to provide a compensation current. The compensation current is used to stabilize the offset voltage within the offset grade.

In the present embodiment, an input of the comparator 1011 is connected to the output of the object quantizer 103, and an output of the comparator 1011 is connected to an input of the analog-to-digital converter 1012, and an output of the analog-to-digital converter 1012 is connected to an input of the current compensator 1013, and an output of the current compensator 1013 is connected to a compensation input of the calibration circuit 102, and the output of the calibration circuit 102 is connect to the offset voltage generating device 104.

Thus, after the offset voltage enters the comparator 1011, the comparator 1011 may obtain the level signal according to the voltage signal converted from the offset voltage and output the level signal to the analog-to-digital converter 1012. The analog-to-digital converter 1012 may generate the control signal according to the level signal. The control signal enters the current compensator and may control the current compensator to output a corresponding compensation current which finally may compensate for a device (i.e. the offset voltage generating device 104) that generates the offset voltage. The compensation current has an effect of calibrating the offset voltage, thereby restraining the offset voltage, and stabilizing the offset voltage within the offset grade.

Combining with the above-described embodiment, the implementation structures of the buffer 1041 and the amplifier 1042 at different phases in this case will be described.

Figure 10:
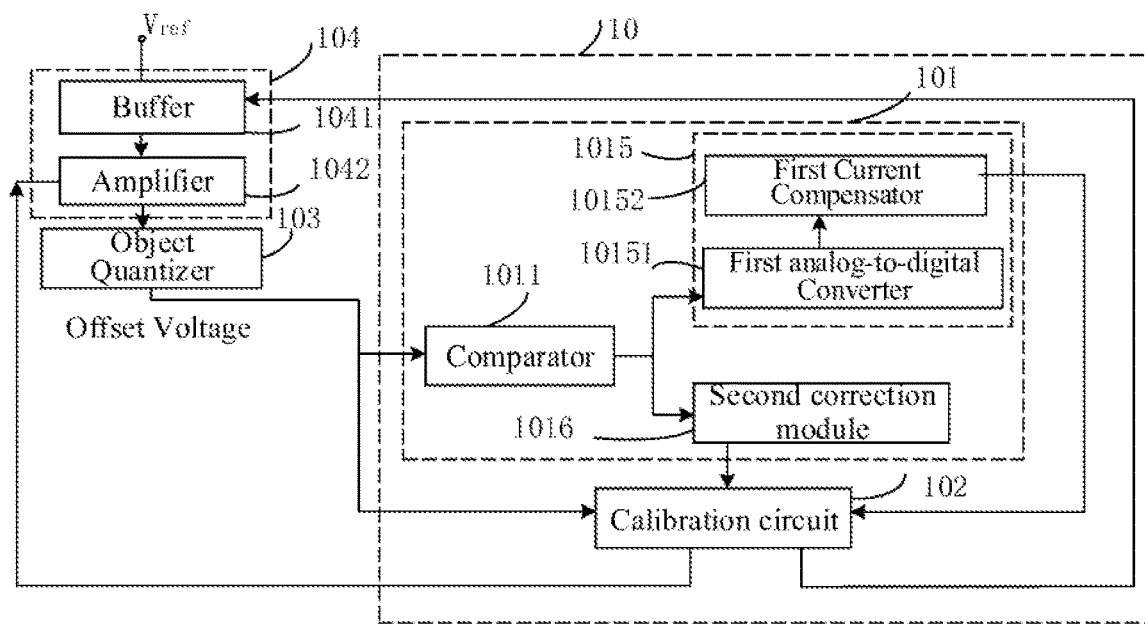
FIG. 10 is a schematic block diagram illustrating the readout circuit according to another embodiment of the present disclosure.
Figure 12:
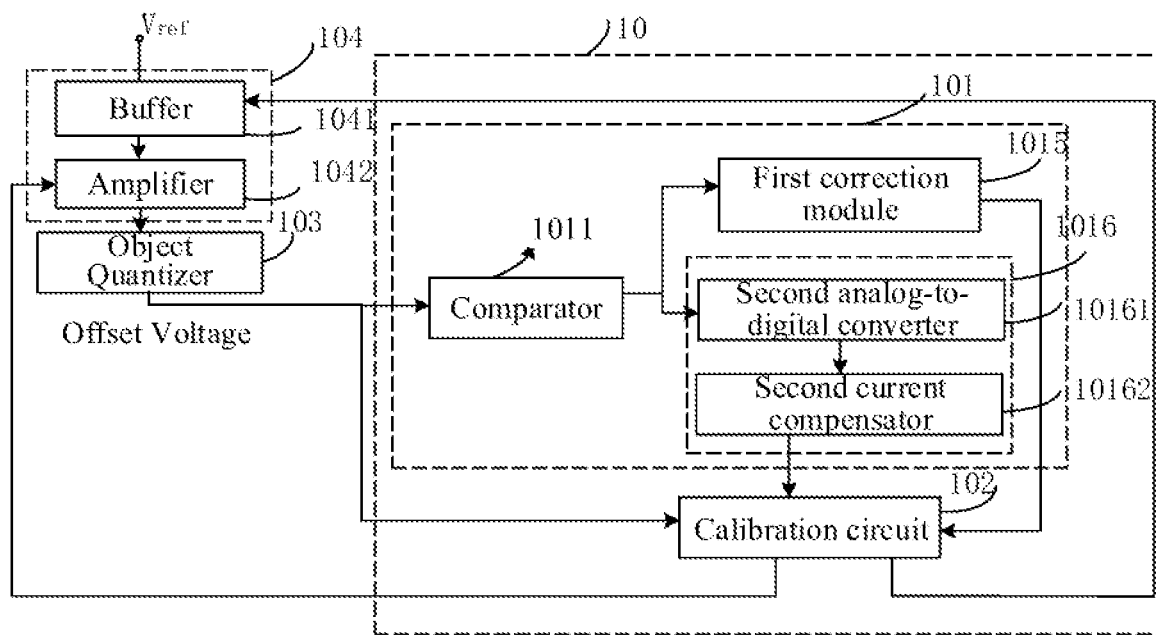
FIG. 12 is a schematic block diagram illustrating the readout circuit according to another embodiment of the present disclosure.

In an embodiment, as shown in FIGS. 10 and 12, the analog-to-digital converter 1012 shown in the embodiment of FIG. 5 includes a first analog-to-digital converter 10151 and a second analog-to-digital converter 10161, and the current compensator 1013 includes a first current compensator 10152 and a second current compensator 10162, and the compensation input of the calibration circuit 102 includes a first input and a second input, and the output of the calibration circuit 102 includes a first output and a second output.

In the above embodiment, the output of the comparator 1011 is connected to an input of the first analog-to-digital converter 10151, an output of the first analog-to-digital converter 10151 is connected to an input of the first current compensator 10152, and an output of the first current compensator 10152 is connected to the first input of the calibration circuit 102, the first output of the calibration circuit 102 is connected to the buffer 1041. The output of the comparator 1011 is connected to an input of the second analog-to-digital converter 10161, an output of the second analog-to-digital converter 10161 is connected to an input of the second current compensator 10162, and an output of the second current compensator 10162 is connected to the second input of the calibration circuit 102, and the second output of the calibration circuit 102 is connected to the amplifier 1042.

The working principles and implementations of the first analog-to-digital converter and the second analog-to-digital converter, and the first current compensator and the second current compensator in the present embodiment are the same as those of the foregoing analog-to-digital converter and current compensator, respectively, and will not be described herein again.

In an embodiment, a first phase switch and a second phase switch may be further included. The comparator and the first analog-to-digital converter are connected via the first phase switch, and the comparator and the second analog-to-digital converter are connected by means of the second phase switch.

It has been mentioned that the phase at which the compensation current is inputted to the buffer is different from the phase at which the compensation current is inputted to the amplifier. Based on this, in the embodiment, the first phase switch is turned on when the offset voltage generated by the buffer is preliminarily corrected. That is, the offset voltage generated by the buffer is preliminarily corrected at the first phase, so that the offset voltage generated by the buffer is corrected to be stabilized within the preset offset grade. Likewise, the second phase switch is turned on when the offset voltage generated by the amplifier is preliminarily corrected. That is, the offset voltage generated by the amplifier is preliminarily corrected at the second phase, so that the offset voltage generated by the amplifier is corrected to be stabilized within the preset offset grade.

Figure 6:
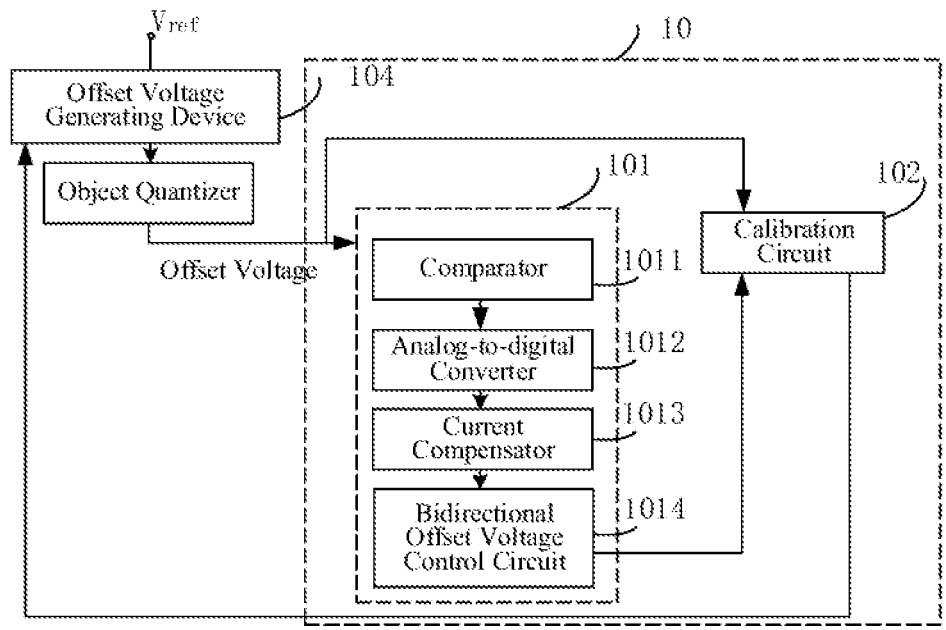
FIG. 6 is a schematic block diagram illustrating the readout circuit according to another embodiment of the present disclosure.

As shown in FIG. 6, in an embodiment, the correction circuit 101 further includes a bidirectional offset voltage control circuit 1014. The compensation current provided by the current compensator 1013 is inputted to the offset voltage generating device 104 via the bidirectional offset voltage control circuit 1014 and the calibration circuit 102, to stabilize the offset voltage within the preset offset grade. The offset voltage generating device 104 is a device that generates an offset voltage in the reference voltage.

Alternatively, an input of the bidirectional offset voltage control circuit 1014 is connected to the output of the current compensator 1013, and an output of the bidirectional offset voltage control circuit 1014 is connected to the compensation input of the calibration circuit 102, and the output of the calibration circuit 102 is connected to the offset voltage generating device 104 and the calibration circuit 102. In FIG. 5, the compensation current of the current compensator 1013 compensates for the offset voltage generating device 104 by means of the bidirectional offset voltage control circuit 1014 and the calibration circuit 102, and the compensation current has the effect of calibrating the offset voltage, thereby restraining the offset voltage, stabilizing the offset voltage within the offset grade, eliminating the offset voltage in the reference voltage and enabling the reference voltage source of the quantizer to be more precise.

In an embodiment, the bidirectional offset voltage control circuit 1014 may include a first bidirectional offset voltage control circuit and a second bidirectional offset voltage control circuit. An input of the first bidirectional offset voltage control circuit is connected to the output of the first current compensator output, an output of the first bidirectional offset voltage control circuit is connected to the first input of the calibration circuit 102, and the first output of the calibration circuit 102 is connected to the buffer 1041. An input of the second bidirectional offset voltage control circuit is connected to an output of the second current compensator, and an output of the second bidirectional offset voltage control circuit is connected to the second input of the calibration circuit 102, and the second output of the calibration circuit 102 is connected to the amplifier 1042.

Figure 7:
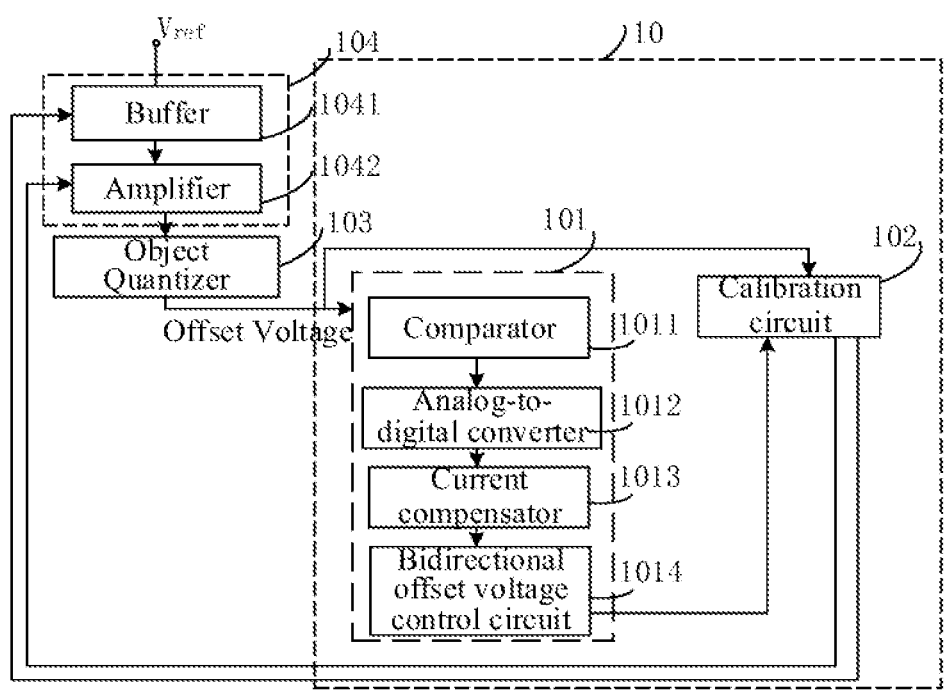
FIG. 7 is a schematic block diagram illustrating the readout circuit according to another embodiment of the present disclosure.

As shown in FIG. 7, the input of the buffer 1041 is the reference voltage terminal Vref, and the output of the buffer 1041 is connected to the input of the amplifier 1042. The output of the amplifier 1042 is connected to the input of the object quantizer 103. The compensation currents provided by the current compensator 1013 is inputted to the buffer 1041 and/or the amplifier 1042 via the bidirectional offset voltage control circuit 1014 and the calibration circuit 102, respectively.

The operating principles and implementations of the first bidirectional offset voltage control circuit and the second bidirectional offset voltage control circuit in the present embodiment are the same as those of the foregoing bidirectional offset voltage control circuit, and are not described repeatedly herein.

Figure 8:
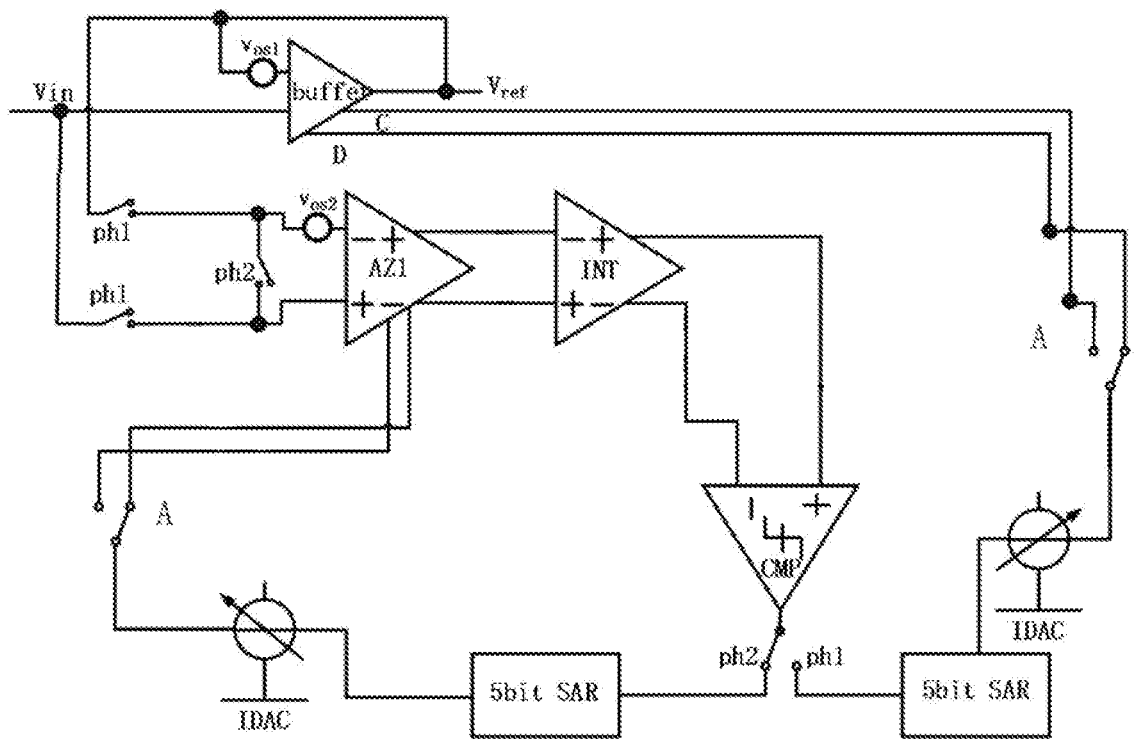
FIG. 8 is a schematic circuit principle diagram illustrating the readout circuit according to another embodiment of the present disclosure.

In this case, in combination with an actual implementation device, an embodiment is provided. As shown in FIG. 8, a sign "buffer" denotes the buffer, "AZ1" denotes the amplifier, "INT" denotes the object quantizer, "CMP" denotes the comparator, "5bit SAR" denotes the analog-to-digital converter, "IDAC" denotes the current compensator, "A" denotes the bidirectional offset voltage control circuit, and "ph1" and "ph2" denote two phases of the phase switch, respectively.

In FIG. 8, there are two analog-to-digital converters 5bit SAR, two current compensators IDAC and two bidirectional offset voltage control circuits A, which correspond to the first phase ph1 and the second phase ph2, respectively.

In FIG. 8, the buffer has an offset voltage Vos1, and the amplifier AZ1 has an offset voltage Vos2. Then, regarding the offset voltage Vos1, at the first phase ph1, the offset voltage Vos1, generated by the buffer when the reference voltage output from the reference voltage terminal Vref is applied to the buffer, is applied to the object quantizer INT, and then to the comparator CMP. The comparator CMP may process the voltage signal converted from the offset voltage to obtain a level signal, and output the level signal to the analog-to-digital converter 5bit SAR corresponding to the first phase ph1. The analog-to-digital converter 5bit SAR corresponding to the first phase ph1 may generate a control signal according to the level signal, and the control signal enters the current compensator IDAC corresponding to the first phase ph1, thereby controlling the current compensator IDAC to output the corresponding compensation current. The compensation current may finally compensate for the buffer to restrain and calibrate the offset voltage Vos1, thereby stabilizing the offset voltage Vos1 within the preset offset grade, and achieving an objective of preliminary correcting the offset voltage Vos1.

Similarly, regarding the offset voltage Vos2, at the second phase ph2, the offset voltage Vos2, generated by the amplifier AZ1 when the reference voltage outputted from the reference voltage terminal Vref is applied to the amplifier AZ1, is applied to the object quantizer INT, and then to the comparator CMP. The comparator CMP may process the voltage signal converted from the offset voltage to obtain a level signal, and output the level signal to the analog-to-digital converter 5bit SAR corresponding to the second phase ph2. The analog-to-digital converter 5bit SAR corresponding to the second phase ph2 may generate a control signal according to the level signal, and the control signal enters the current compensator IDAC corresponding to the second phase ph2, thereby controlling the current compensator IDAC to output the corresponding compensation current. The compensation current may finally compensate for the amplifier AZ1 to restrain and calibrate the offset voltage Vos2, thereby stabilizing the offset voltage Vos2 within the preset offset grade, and achieving an objective of preliminary correcting the offset voltage Vos2.

In another embodiment, it is also possible to describe the above correction circuits including a first correction module and a second correction module.

Figure 9:
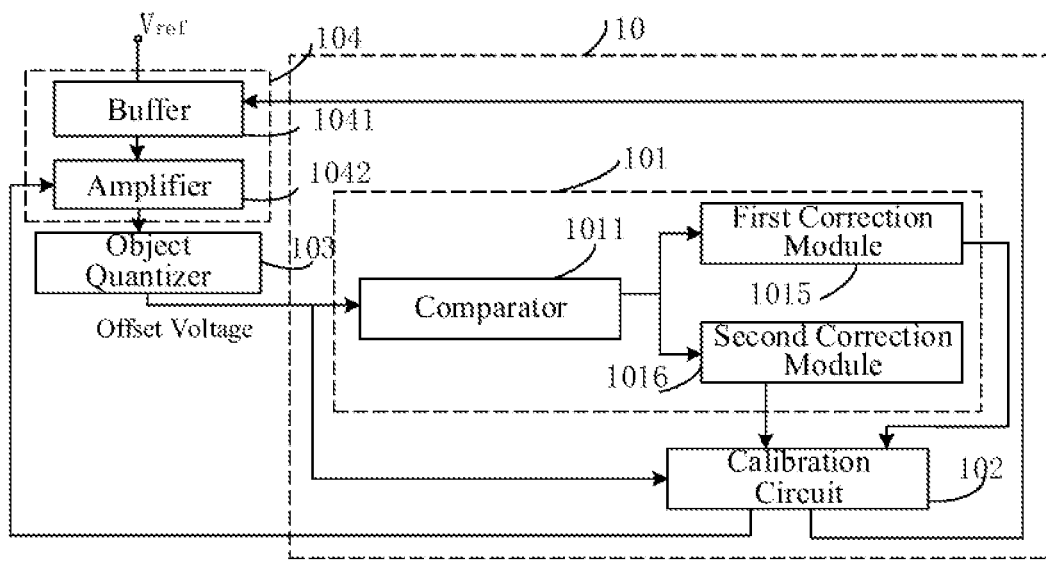
FIG. 9 is a schematic block diagram illustrating the readout circuit according to another embodiment of the present disclosure.

As shown in FIG. 9, in an embodiment, the correction circuit 101 includes the comparator 1011, the first correction circuit module 1015, and the second correction module 1016. The input of the comparator 1011 is connected to the output of the object quantizer 103, and the output of the comparator 1011 is connected to an input of the first correction module 1015 and an input of the second correction module 1016, respectively. An output of the first correction module 1015 is connected to the first input of the calibration circuit 102, and the first output of the calibration circuit 102 is connected to the buffer 1041, and an output of the second correction circuit 1016 is connected to the second input of the calibration circuit 102, and the second output of the calibration circuit 102 is connected to the amplifier 1042.

In this embodiment, the input of the comparator 1011 is connected to the output of the object quantizer 103, and the output of the comparator 1011 is connected to the input of the first correction module 1015 and the input of the second correction module 1016, respectively. In this way, after the offset voltage enters the comparator 1011, the comparator 1011 may obtain a level signal according to the voltage signal converted from the offset voltage, and output the level signal to the first correction module 1015 or to the second correction module 1016. The first correction module 1015 may generate the compensation current passing the calibration circuit 102 and correspondingly fed back into the buffer 1041 according to the level signal, and the second correction module 1016 may generate the compensation current passing the calibration circuit 102 and correspondingly fed back into the amplifier 1042 according to the level signal. Since the compensating currents may eventually compensate for the offset voltage generating device (the buffer or the amplifier) which generates the above-mentioned offset voltage, and the compensating current has the function of calibrating the offset voltage, which restrains the offset voltage, thereby stabilizing the offset voltage produced by the buffer or the amplifier within the preset offset grade.

In an embodiment, as shown in FIG. 10, the first correction module 1015 includes a first analog-to-digital converter 10151, and the first current compensator 10152. The output of the comparator 1011 is connected to an input of the first analog-to-digital converter 10151, an output of the first analog-to-digital converter 10151 is connected to an input of the first current compensator 10152, and an output of the first current compensator 10152 is connected to the buffer 1041.

The output of the comparator 1011 is connected to the input of the first analog-to-digital converter 10151, so that after the offset voltage enters the comparator 1011, the comparator 1011 may obtain a level signal according to the voltage signal converted from the offset voltage, and the level signal is inputted to the first analog-to-digital converter 10151 to generate a control signal. The output of the first analog-to-digital converter 10151 is connected to the input of the first current compensator 10152, thus the control signal generated by the first analog-to-digital converter 10151 enters the first current compensator 10152 and may control the first current compensator 10152 to output the corresponding compensation current. The compensation current may finally compensate for the buffer 1041 which generates the offset voltage. The compensation current may calibrate and restrain the offset voltage generated by the buffer 1041, thereby stabilizing the offset voltage generated by the buffer 1041 within the preset offset grade.

Figure 11:
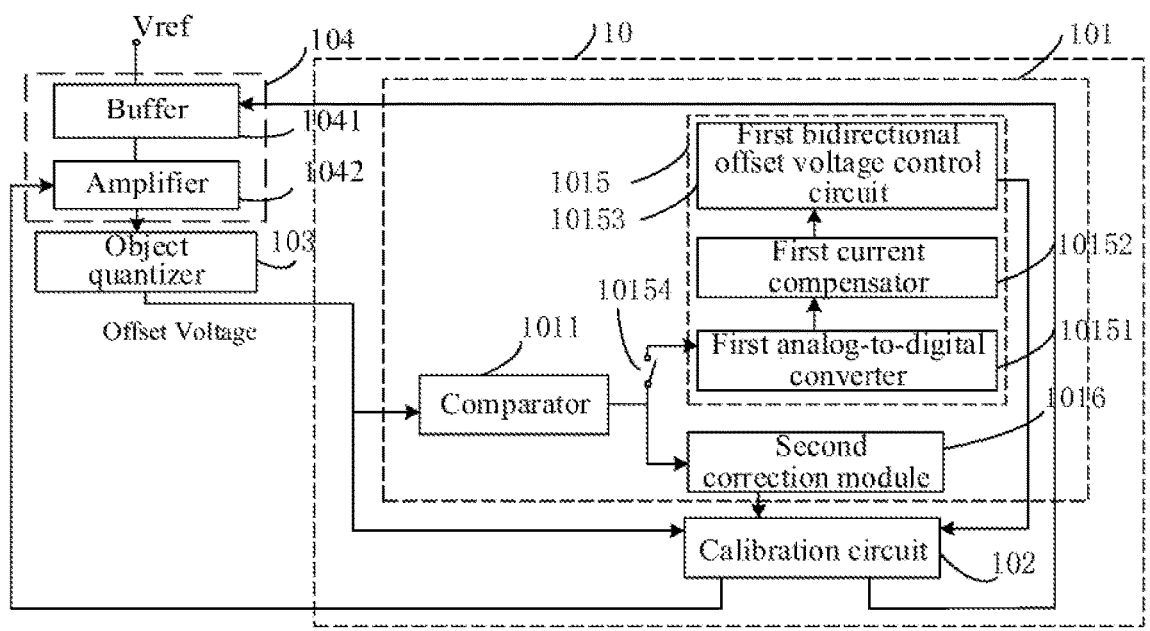
FIG. 11 is a schematic block diagram illustrating the readout circuit according to another embodiment of the present disclosure.

In some embodiments, as shown in FIG. 11, the first correction module 1015 further includes a first bidirectional offset voltage control circuit 10153, an input of the first bidirectional offset voltage control circuit 10153 is connected to an output of the first current compensator 10152, and an output of the first bidirectional offset voltage control circuit 10153 is connected to the buffer 1041. Specifically, the compensation current provided by the first current compensator 10152 is inputted to the buffer 1041 through the first bidirectional offset voltage control circuit 10153 and the calibration circuit 102, thereby calibrating and restraining the offset voltage generated by the buffer 1041, and stabilizing the offset voltage of the buffer 1041 within the preset offset grade.

As mentioned above, the first correction module 1015 and the second correction module 1016 calibrate and eliminate the offset voltages generated by different offset voltage generating devices at different phases. Based on this, in an embodiment, as shown in FIG. 11, the first correction module 1015 further includes a first phase switch 10154, and the comparator 1011 and the first analog-to-digital converter 10151 are connected via the first phase switch 10154.

The first phase switch 10154 is turned on when the offset voltage of the buffer 1041 is being preliminarily corrected by the first correction module 1015. That is, the first correction module 1015 preliminarily corrects the offset voltage generated by the buffer 1041 at the first phase, so that the corrected offset voltage of the buffer 1041 is stabilized within the preset offset grade.

In another embodiment, as shown in FIG. 12, the second correction module 1016 includes a second analog-to-digital converter 10161, and a second current compensator 10162. The output of the comparator 1011 is connected to an input of the second analog-to-digital converter 10161, and an output of the second analog-to-digital converter 10161 is connected to an input of the second current compensator 10162, and an output of the second current compensator 10162 is connected to the second input of the calibration circuit 102, and the second output of the calibration circuit 102 is connected to the amplifier 1042.

The output of the comparator 1011 is connected to the input of the second analog-to-digital converter 10161, so that after the offset voltage enters the comparator 1011, the comparator 1011 may obtain a level signal according to a voltage signal converted from the offset voltage, and the level signal is inputted to the second analog-to-digital converter 10161 to generate a control signal. The output of the second analog-to-digital converter 10161 is connected to the input of the second current compensator 10162, and then the control signal generated by the second analog-to-digital converter 10161 enters the second current compensator 10162 to control the first current compensator 10162 to output the corresponding compensation current, which may finally compensate for the amplifier 1042. The compensation current calibrates and restrains the offset voltage generated by the amplifier 1042, thereby stabilizing the offset voltage generated by the amplifier 1042 within the preset offset grade.

Figure 13:
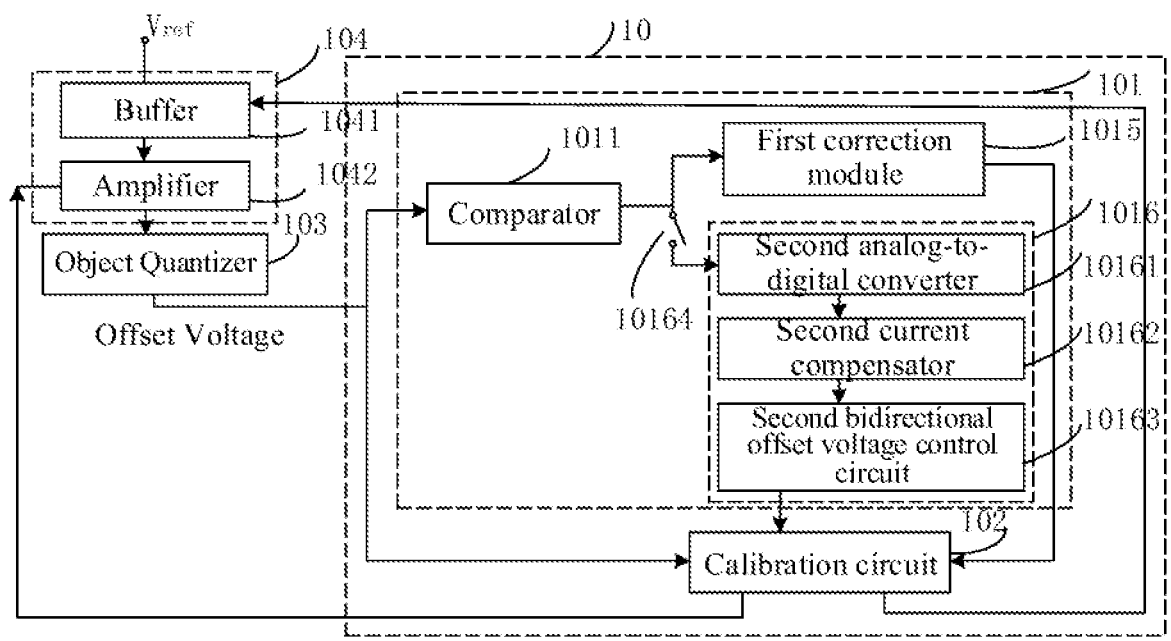
FIG. 13 is a schematic block diagram illustrating the readout circuit according to another embodiment of the present disclosure.

In an embodiment, as shown in FIG. 13, the second correction module 1016 further includes a second bidirectional offset voltage control circuit 10163, an input of the second bidirectional offset voltage control circuit 10163 is connected to the output of the second current compensator 10162, and an output of the second bidirectional offset voltage control circuit 10163 is connected to the second input of the calibration circuit 102, and the second output of the calibration circuit 102 is connected to the amplifier 1042. Specifically, the compensation current provided by the second current compensator 10162 is inputted to the amplifier 1042 through the second bidirectional offset voltage control circuit 10163 and the calibration circuit 102, and the offset voltage generated by the amplifier 1042 is calibrated and restrained, thereby stabilizing the offset voltage of the amplifier 1042 within the preset offset grade.

As mentioned above, the first correction module 1015 and the second correction module 1016 calibrate and eliminate offset voltages generated by different offset voltage generating devices at different phases. Based on this, in an embodiment, as shown in FIG. 13, the second correction module 1016 further includes a second phase switch 10164 connected between the comparator 1011 and the second analog-to-digital converter 10161.

The second phase switch 10164 is turned on when the offset voltage of the amplifier 1042 is being preliminarily corrected by the second correction module 1016. That is, the second correction module 1016 preliminarily corrects the offset voltage generated by the amplifier 1042 at the second phase, thereby stabilizing the corrected offset voltage of the amplifier 1042 within the preset offset grade.

In an embodiment of the present disclosure, different compensation currents are provided through the correction circuits at two phases, and each of the compensation currents is inputted to the buffer or the amplifier through a corresponding bidirectional offset voltage control circuit to calibrate and restrain the offset voltage of the buffer or the amplifier.

In combination with the above-described embodiments, schematic structural diagrams of the implementation of the correction circuit are illustrated for the buffer 1041 and the amplifier 1042 at different phases, respectively.

Figure 14:
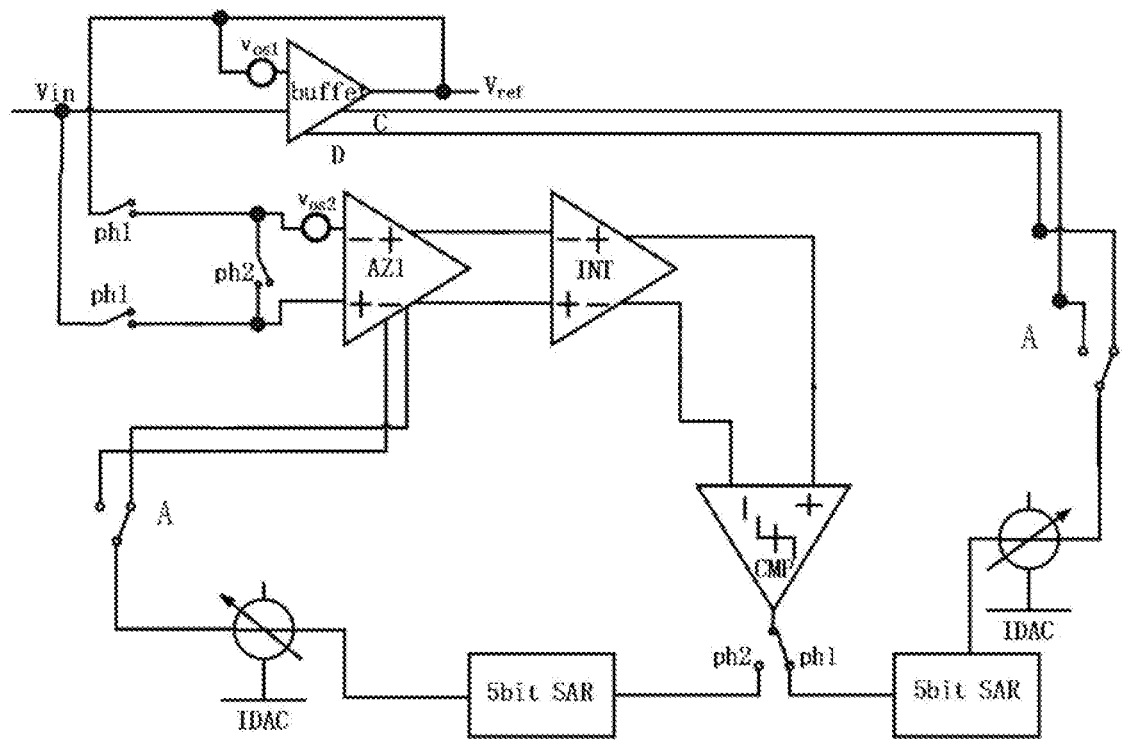
FIG. 14 is a schematic circuit principle diagram illustrating the readout circuit according to another embodiment of the present disclosure.

In an embodiment, as shown in FIG. 14, a sign "buffer" denotes the buffer, "AZ1" denotes the amplifier, "INT" denotes the object quantizer, "CMP" denotes the comparator, "5bit SAR" denotes the analog-to-digital converter, "IDAC" denotes the current compensator, "A" denotes the bidirectional offset voltage control circuit, and ph1 and ph2 denote two phases of the phase switch, respectively, in which the phase ph1 corresponds to the process of the first correction module, and the phase ph2 corresponds to the process of the second correction module.

In FIG. 14, there are two analog-to-digital converters 5bit SAR, two current compensators IDAC and two bidirectional offset voltage control circuits A, which correspond to the first phase ph1 and the second phase ph2, respectively.

In FIG. 14, the buffer has an offset voltage Vos1, and the amplifier AZ1 has an offset voltage Vos2. Then, regarding the offset voltage Vos1, at the first phase ph1, the offset voltage Vos1, generated by the buffer when the reference voltage output from the reference voltage terminal Vref is applied to the buffer, is applied to the object quantizer INT, and then to the comparator CMP. The comparator CMP may process the voltage signal converted from the offset voltage to obtain a level signal, and output the level signal to the analog-to-digital converter 5bit SAR corresponding to the first phase ph1. The analog-to-digital converter 5bit SAR corresponding to the first phase ph1 may generate a control signal according to the level signal, and the control signal enters the current compensator IDAC corresponding to the first phase ph1, thereby controlling the current compensator IDAC to output the corresponding compensation current. The compensation current may finally compensate for the buffer to restrain and calibrate the offset voltage Vos1, thereby stabilizing the offset voltage Vos1 within the preset offset grade, and achieving an objective of preliminary correcting the offset voltage Vos1.

Similarly, regarding the offset voltage Vos2, at the second phase ph2, the offset voltage Vos2, generated by the amplifier AZ1 when the reference voltage outputted from the reference voltage terminal Vref is applied to the amplifier AZ1, is applied to the object quantizer INT, and then to the comparator CMP. The comparator CMP may process the voltage signal converted from the offset voltage to obtain a level signal, and output the level signal to the analog-to-digital converter 5bit SAR corresponding to the second phase ph2. The analog-to-digital converter 5bit SAR corresponding to the second phase ph2 may generate a control signal according to the level signal, and the control signal enters the current compensator IDAC corresponding to the second phase ph2, thereby controlling the current compensator IDAC to output the corresponding compensation current. The compensation current may finally compensate for the amplifier AZ1 to restrain and calibrate the offset voltage Vos2, thereby stabilizing the offset voltage Vos2 within the preset offset grade, and achieving an objective of preliminary correcting the offset voltage Vos2.

The implementation structure of the correction circuit 101 is described above, and the implementation structure of the calibration circuit 102 in the offset voltage elimination circuit 10 will be described herein based on the above embodiments.

Figure 15:
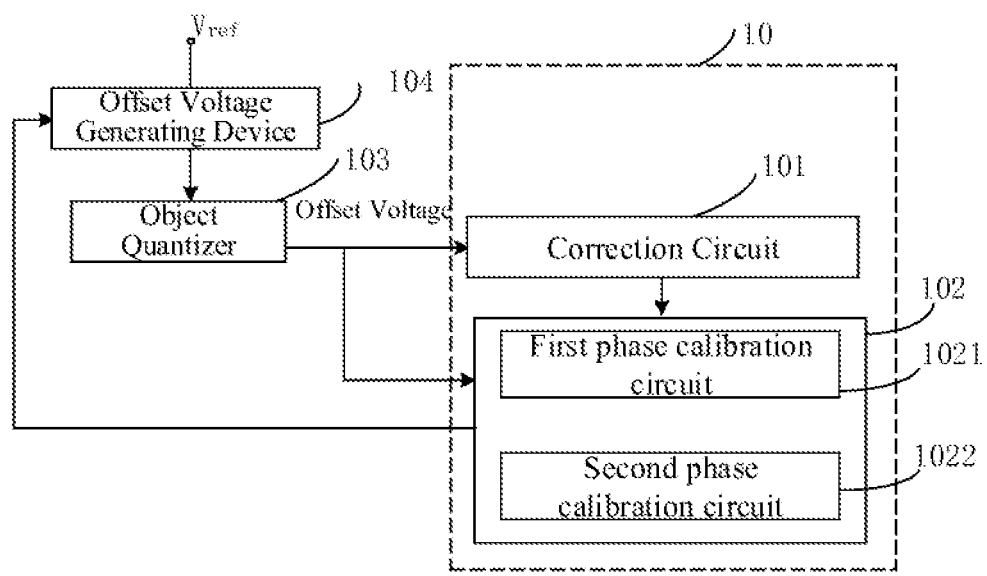
FIG. 15 is a schematic block diagram illustrating the readout circuit according to another embodiment of the present disclosure.

Based on any one of the above embodiments, as shown in FIG. 15, in an embodiment, the offset voltage elimination circuit 10 is provided in which the calibration circuit 102 includes a first phase calibration circuit 1021 and a second phase calibration circuit 1022. The first phase calibration circuit 1021 and the second phase calibration circuit 1022 are configured to conduct fine-adjustment calibrations on the offset voltages at different phases, respectively.

In the present embodiment, reference inputs of the first phase calibration circuit 1021 and the second phase calibration circuit 1022 are both connected to the output of the object quantizer 103, compensation inputs of the first phase calibration circuit 1021 and the second phase calibration circuit 1022 are both connected to the output of the correction circuit 101, and outputs of the first phase calibration circuit 1021 and the second phase calibration circuit 1022 are both connected to the offset voltage generating device 104.

The first phase calibration circuit 1021 and the second phase calibration circuit 1022 are configured to conduct fine-adjustment calibrations on the offset voltages at different phases. For example, at the first phase ph1, the offset voltage generated by the buffer is finely adjusted and calibrated, and at the second phase ph2, the offset voltage generated by the amplifier is finely adjusted and calibrated.

Figure 16:
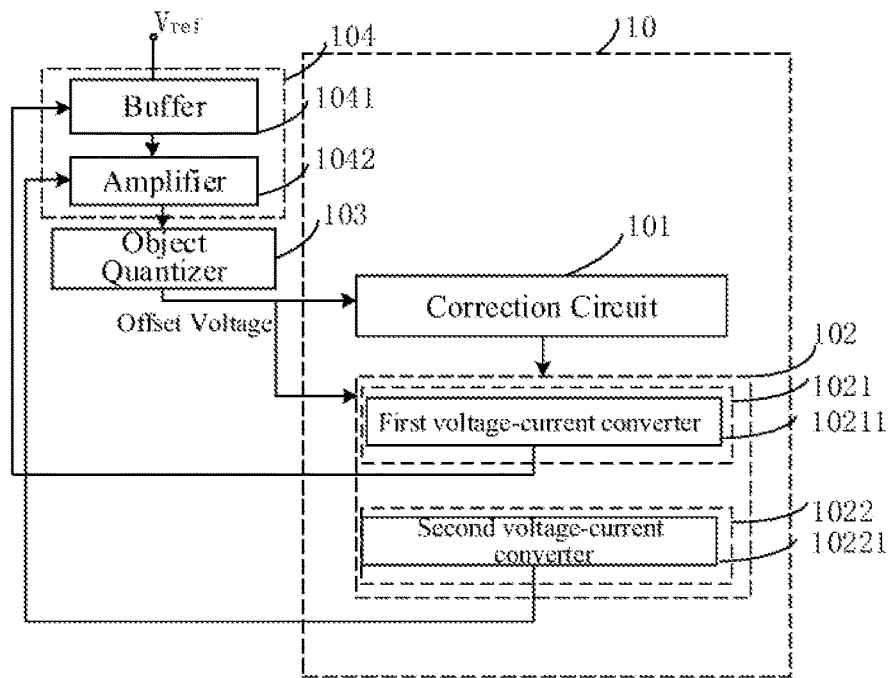
FIG. 16 is a schematic block diagram illustrating the readout circuit according to another embodiment of the present disclosure.

In an embodiment, as shown in FIG. 16, the first phase calibration circuit 1021 includes a first voltage-current converter 10211, and the second phase calibration circuit 1022 includes the second voltage-current converter 10221. The amplifier 1042 is configured to, at the first phase, convert the offset voltage generated by the buffer 1041 to a first offset current, or at the second phase, make the input of the buffer 1041 short-circuit and convert an offset voltage generated by itself into a second offset current. The object quantizer 103 is configured to integrate the first offset current to obtain a corresponding first voltage signal, or to integrate the second offset current to obtain a corresponding second voltage signal. The first voltage-current converter 10211 is configured to generate a first fine-adjustment compensation current based on the first voltage signal and the first voltage signal corrected by the correction circuit 101, and to enable the first fine-adjustment compensation current to compensate for the buffer 1041. The second voltage-current converter 10221 is configured to generate a second fine-adjustment compensation current based on the second voltage signal and the second voltage signal corrected by the correction circuit 101, and to enable the second fine-adjustment compensation current to compensate for the amplifier 1042.

In the present embodiment, reference inputs of both the first voltage-current converter 10211 and the second voltage-current converter 10221 are connected to the output of the object quantizer, compensation inputs of both the first voltage-current converter 10211 and the second voltage-current converter 10221 are connected to the output of the correction circuit 101, and an output of the first voltage-current converter 10211 is connected to the buffer 1041. An output of the second voltage-current converter 10221 is connected to the amplifier 1042.

In practical applications, at the first phase, the offset voltage generated by the buffer 1041 may be applied to the amplifier 1042, and the amplifier 1042 converts the offset voltage generated by the buffer 1041 and outputs the first offset current. The first offset current enters the object quantizer 103, and the object quantizer 103 integrates the first offset current to obtain the corresponding first voltage signal. Based on the first voltage signal and the corrected first voltage signal, the first voltage-current converter generates the first fine-adjustment compensation current, and the first fine-adjustment compensation current enters the buffer 1041, to conduct a fine-adjustment calibration on the offset voltage generated by the buffer 1041 to further eliminate the offset voltage of the buffer 1041.

At the second phase, the offset voltage generated by the amplifier 1042 is converted by the amplifier 1042 itself and outputted as the second offset current. The second offset current enters the object quantizer 103. The object quantizer 103 integrates the second offset current to obtain a corresponding second voltage signal. Based on the second voltage signal and the corrected second voltage signal, the second voltage-current converter 10221 generates the second fine-adjustment compensation current, and the second fine-adjustment compensation current enters the amplifier, to conduct a fine-adjustment calibration on the offset voltage generated by the amplifier to further eliminate the offset voltage of the amplifier.

Figure 17:
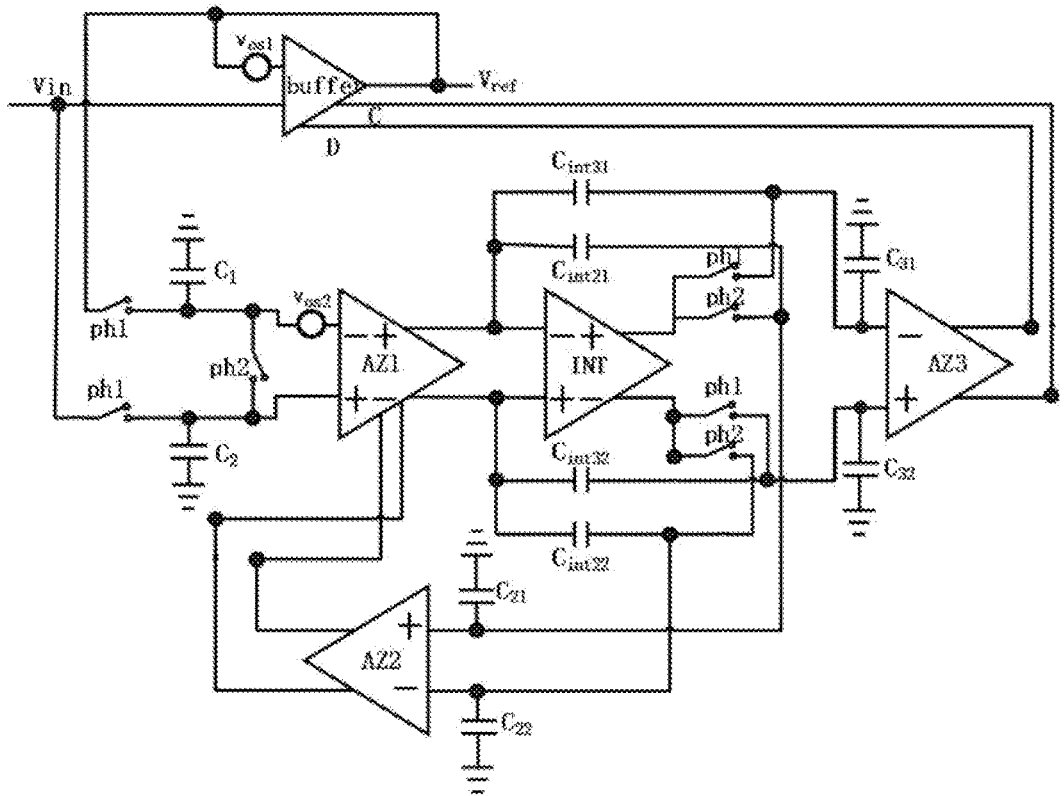
FIG. 17 is a circuit principle diagram illustrating the readout circuit according to another embodiment of the present disclosure.

Specifically, as shown in FIG. 17, "buffer" denotes the buffer, AZ1 denotes the amplifier, INT denotes the object quantizer, ph1 and ph2 denote two phases of the switch, respectively, AZ2 denotes the second voltage-current converter, and AZ3 denotes the first voltage-current converter. For the buffer in FIG. 17, the offset voltage thereof is Vos1, and for the amplifier AZ1, the offset voltage thereof is Vos2.

Then, regarding the offset voltage Vos1, at the first phase ph1, the offset voltage Vos1, generated when the reference voltage output from the reference voltage terminal Vref is applied to the buffer, is applied first to the amplifier AZ1. The amplifier AZ1 converts the offset voltage Vos1 to the first offset current and outputs the current, and the first offset current enters the object quantizer INT. The object quantizer INT integrates the first offset current to obtain the corresponding first voltage signal. Then, the first voltage signal enters the first voltage-current converter AZ3, and the first voltage-current converter AZ3 may generate the first fine-adjustment compensation current, and the first fine-adjustment compensation current may enter the buffer again, thereby performing the fine-adjustment calibration on the offset voltage Vos1 generated by the buffer, and further eliminating the offset voltage Vos1 of the buffer.

Then, regarding the offset voltage Vos2, at the first phase ph2, the offset voltage Vos2 is generated when the reference voltage output from the reference voltage terminal Vref is applied to the amplifier AZ1. The amplifier AZ1 converts the offset voltage Vos2 to the second offset current and outputs the current, and the second offset current enters the object quantizer INT. The object quantizer INT integrates the second offset current to obtain the corresponding second voltage signal. Then, the second voltage signal is applied to the second voltage-current converter AZ2, and the second voltage-current converter AZ2 may generate the second fine-adjustment compensation current, and the second fine-adjustment compensation current may enter the amplifier AZ1 again, thereby performing the fine-adjustment calibration on the offset voltage Vos2 generated by the amplifier AZ1, thereby further eliminating the offset voltage Vos2 of the amplifier AZ1.

It should be noted that, in FIG. 17, filter capacitors C1, C2, Cint31, Cint21, Cint32, Cint22, C31, C32, C21, and C22 are further included. These filter capacitors may be provided according to actual requirements, and the filter capacitors may eliminate high-frequency components in the circuit to achieve the filtering effect.

In the embodiments of the present disclosure, the offset voltages generated by different offset voltage generating devices are finely adjusted and calibrated by the different phase calibration circuits at different phases respectively, thereby eliminating the offset voltages, and making the reference voltage of the object quantizer more precise.

Figure 18:
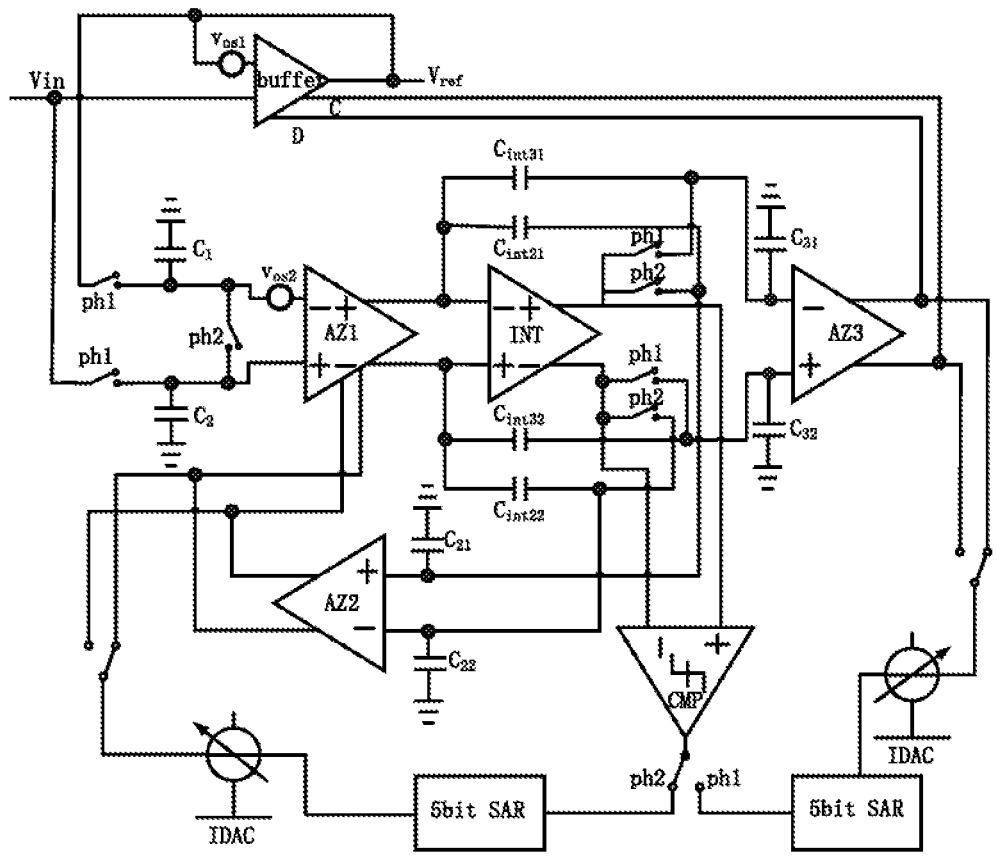
FIG. 18 is a circuit principle diagram illustrating the readout circuit according to another embodiment of the present disclosure.

In addition, with reference to FIG. 18, the meanings of the devices shown in FIG. 18 may be described in the foregoing embodiments, and details are omitted herein. Combining with FIG. 18, the process of eliminating the offset voltage in the reference voltage of the coarse quantizer is described in two different ways.

In an embodiment, it may be understood that FIG. 18 includes a fast correction process and a fine adjustment process, i.e., a fast correction is performed in a case that the offset amplitude is relatively large, to achieve a relatively small corrected offset grade, and after the fast adjustment, the remaining offset is finely adjusted and calibrated, thereby obtaining a precise reference voltage of the coarse quantizer.

When the offset voltage of the coarse quantizer is being eliminated, the embodiment includes the following processes.

1. A fast correction is made in a case that the offset amplitude is relatively large, to achieve a relatively small corrected offset grade, which may be implemented by using a digital-analog hybrid circuit.

Specifically, the digital-to-analog hybrid circuit includes a comparator CMP, the analog-to-digital converter 5bit SAR, a current compensator IDAC (also referred to as a current digital-to-analog converter), and a bidirectional offset voltage control circuit.

The integrator INT generates an offset voltage based on an output current of the amplifier AZ1, the offset voltage acts as an input of the comparator CMP which may output a level signal based on the offset voltage. The level signal may be applied to the corresponding analog-to-digital converter 5bit SAR at different phases ph1 and ph2, respectively. The analog-to-digital converter 5bit SAR may provide a control signal for the current interim digital-to-analog converter IDAC based on the level signal. The control signal is used to control the magnitude of the compensation current provided by the corresponding current interim digital-to-analog converter IDAC, and the compensation current correspondingly compensates for the amplifier AZ1 or the buffer. Because the compensation of the compensation current has a function of calibrating the offset voltage, which is equivalent to restraining the offset voltage, the compensation current may rapidly stabilize the offset voltages Vos1 and Vos2 in FIG. 18 within a relatively small range.

2. The process of performing the fine-adjustment calibration on the remaining offset after the fast adjustment may be implemented by an analog circuit, which corresponds to the phase ph2 and mainly includes a loop formed by an amplifier AZ1, an integrator INT, and a voltage-current converter AZ2. The loop is configured to zero the offset voltage of the devices such as the amplifier AZ1 and the like. At this time, the input of the amplifier AZ1 short-circuits, and the current output from the amplifier AZ1 is integrated by the integrator INT, and the offset voltage generated by the integration of the integrator INT is applied to the voltage-current converter AZ2, and the voltage-current converter AZ2 converts the offset voltage generated by the integration of the integrator INT into the current, and the current compensates for the amplifier AZ1, thereby eliminating the offset voltage Vos2 in the coarse quantizer, and finely adjusting and calibrating the offset voltage Vos2 in the reference voltage of the coarse quantizer.

At the phase ph1, the above analog circuit mainly includes a loop formed by the amplifier AZ1, the integrator INT, the voltage-current converter AZ3, and the buffer, and configured to mainly finish calibrating the offset voltage of the buffer. In this case, the amplifier AZ1 captures the offset voltage Vos1 of the buffer to act as the input of the amplifier AZ1, the output current of the amplifier AZ1 is integrated by the integrator INT. The offset voltage generated by the integration of the integrator INT is applied to the voltage-current converter AZ3, and the voltage-current converter AZ3 converts the offset voltage generated by the INT integration into the current compensating for the amplifier buffer, thereby eliminating the offset voltage Vos1 in the coarse quantizer, so that the offset voltage in the reference voltage of the coarse quantizer is finely adjusted and calibrated.

In another embodiment, still refer to FIG. 18, it may be understood that FIG. 18 includes a calibration process at two phases, each of which corresponds to eliminating one offset voltage. The phase ph2 corresponds to the phase at which elimination of offset voltage Vos2 in the amplifier AZ1 is performed, and the phase ph1 corresponds to the phase at which the elimination of offset voltage Vos1 in the buffer is performed, thereby obtaining a precise reference voltage of the coarse quantizer.

Specifically, when offset voltage elimination is performed on the offset voltage of the coarse quantizer, the embodiment includes processes of (i) eliminating the offset voltage Vos2 in the amplifier AZ1, and (ii) eliminating the offset voltage Vos1 in the buffer.

The circuit control strategy for eliminating the offset voltage Vos2 in the amplifier AZ1 is as follows: the phase switch ph2 is turned on and the phase switch ph1 is turned off, and at the same time the input of the amplifier AZ1 short-circuits, i.e., the output current of the amplifier AZ1 is output from the amplifier AZ1 and then enters the integrator INT.

On the one hand, the offset voltage generated by the integration of the integrator INT acts as an input of the comparator CMP, and based on the offset voltage, the comparator CMP outputs a level signal which enters the analog-to-digital converter 5bit SAR by means of the phase switch Ph2. The analog-to-digital converter 5bit SAR may provide a control signal for the current digital-to-analog converter IDAC according to the level signal, and the control signal is configured to control the amplitude of the compensation current provided by the current digital-to-analog converter IDAC. The compensation current compensates for the amplifier AZ1, and may quickly stabilize the offset voltage Vos2 within a relatively small range because the compensation of the compensation current has a calibration effect on the offset voltage, which is equivalent to restraining the offset.

On the other hand, the offset voltage generated by the integration of the integrator INT is applied to the voltage-current converter AZ2, and the voltage-current converter AZ2 converts the offset voltage generated by the integration of the integrator INT into the compensation current to input the amplifier AZ1, thereby eliminating the offset voltage Vos2 in the coarse quantizer, and achieving the fine-adjustment calibration for the offset voltage Vos2 in the reference voltage of the coarse quantizer.

The circuit control strategy for eliminating the offset voltage Vos1 at the buffer is as follows: the phase switch ph2 is turned off and the phase switch ph1 is turned on. At this time, the amplifier AZ1 captures the offset voltage Vos1 in the buffer to act as the input of the amplifier AZ1, i.e., the output current of the amplifier AZ1 enters the integrator E and is further integrated.

On the one hand, the offset voltage obtained by the integration of the integrator INT acts as an input to the comparator CMP, based on the offset voltage the comparator CMP outputs a level signal, which is applied to the analog-to-digital converter 5bit SAR by means of the phase switch Ph1. The analog-to-digital converter 5bit SAR may provide a control signal for the current interim digital-to-analog converter IDAC according to the level signal, and the control signal may be used to control the amplitude of the compensation current provided by the current interim digital-to-analog converter IDAC. The compensation current compensates for the Amplifier AZ1, and may quickly stabilize the offset voltage Vos1 within a relatively small range because the compensation of the compensation current for the offset voltage has a calibration effect which is equivalent to restraining the offset.

On the other hand, the offset voltage generated by the integration of the integrator INT is applied to the voltage-current converter AZ3, which converts the offset voltage generated by the integration of the integrator INT into the compensation current for the buffer, thereby eliminating the offset voltage Vos1 in the coarse quantizer, and realizing the fine-adjustment calibration for the offset voltage Vos1 in the reference voltage of the coarse quantizer.

Further, the filter capacitors C1, C2, Cint31, Cint21, Cint32, Cint22, C31, C32, C21, and C22 in FIG. 18 may be provided according to actual requirements and may eliminate high-frequency components in the circuit to achieve a filtering effect.

In the above-described embodiment, the process of eliminating the offset voltages in the reference voltage of the object quantizer is described in different ways. In any way, the offset voltage is restrained by generating different currents and feeding them back to the offset voltage generating device, which may eliminate the offset voltage in the reference voltage of the object quantizer, and ensure the reference voltage source of the object quantizer to be more precise.

What described above are the processes of eliminating and calibrating the offset voltage in the reference voltage of the coarse quantizer in the readout circuit. In an embodiment, for the fine quantizer in the readout circuit, the noise in the reference voltage source of the fine quantizer does not predominate in the entire system, and the flicker noise of the fine quantizer needs not to be eliminated, and the error caused by the mismatch or the offset of the fine quantizer only changes the Least Significant Bit of the fine quantizer, which is equivalent to introducing a linear gain error that may be eliminated in the system-level consistent gain calibration.

In practical applications, the mismatch in the reference voltage source of the fine quantizer will be converted into a difference in the LSB of the fine quantizer, which is only a linear gain error and will be eliminated by the system level consistent gain calibration. For example, the fine quantizer, as a post-stage circuit, is equivalent to the input, which means that there is a fixed gain to reduce noise.

Figure 19:
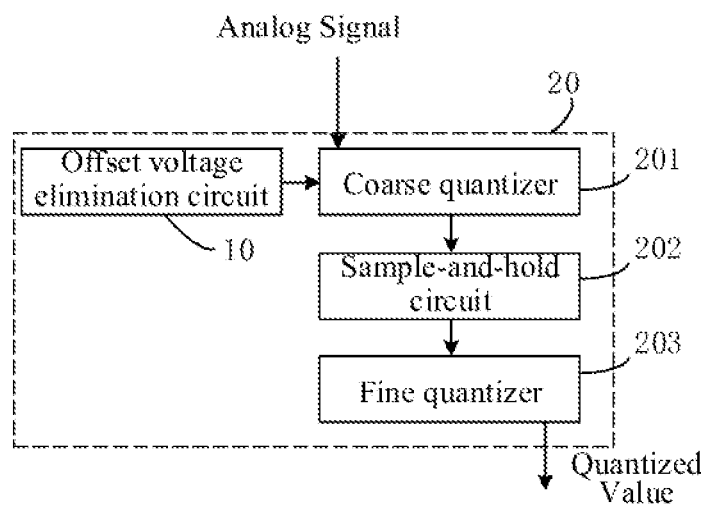
FIG. 19 is a schematic block diagram illustrating the readout circuit according to another embodiment of the present disclosure.

In some of the embodiments, as shown in FIG. 19, the present disclosure further provides a readout circuit 20, which includes a coarse quantizer 201, a sample-and-hold circuit 202, a fine quantizer 203, and the offset voltage elimination circuit 10. The coarse quantizer 201 is configured to perform a coarse quantization on the analog signal to obtain a first quantized signal. The reference voltage of the coarse quantizer 201 is the voltage processed by eliminating the offset voltage by means of the offset voltage elimination circuit 10. The elimination process includes preliminary correcting the offset voltage in the reference voltage of the coarse quantizer to stabilize the corrected offset voltage within a preset offset grade, and finely adjusting and calibrating the corrected offset voltage. The sample-and-hold circuit 202 is configured to perform a sample-and-hold processing on the first quantized signal. The fine quantizer 203 is configured to perform a fine quantization on the sampled and held first quantized signal to obtain a quantized value corresponding to the analog signal.

In an embodiment, the coarse quantizer is an integrator, and the fine quantizer is the analog-to-digital converter.

In an embodiment, a plurality of coarse quantizers correspond to one fine quantizer.

For the readout circuit provided by the present embodiment, please refer to the description of the schematic diagram of the readout circuit of FIG. 1, and the readout circuit will not be illustrated herein.

In addition, an embodiment of the present disclosure further provides a processor. The processor includes any one of the readout circuits provided in the embodiments above. In an embodiment, a computer device is further provided, and the computer device includes a processor implementing any one of the readout circuits.

A processor can be regarded as a very large-scale integrated circuit, which includes arithmetic units, controllers, registers, memories, readout circuits, and so on. The processors include but are not limited to a central processing unit (CPU), a graphics processing unit (GPU), a field programmable gate array (FPGA), a digital signal processor, (DSP), an application specific integrated circuit (ASIC), etc., which are not limited in this embodiment of the present disclosure.

The computer device means any terminal or electronic device that requires an external power supply or a built-in power supply, such as various personal computers, notebook computers, mobile phones (smart mobile terminals), tablet computers, and portable wearable devices, which are not limited in this embodiment. If it is an external power source, the power source may be a power adapter, a mobile power source (a portable charger, a travel charger), etc., which is not limited in this embodiment. The computer device may include any processor implementing any one of the readout circuits.

Figure 20:
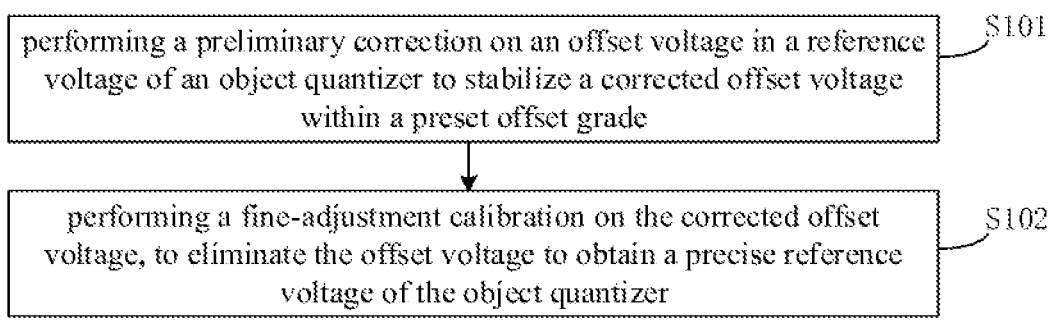
FIG. 20 is a schematic flowchart diagram of an offset voltage eliminating method according to an embodiment of the present disclosure.

In addition, embodiments of the present disclosure also provide an offset voltage eliminating method, the offset voltage eliminating method may be applied to a readout circuit, and as shown in FIG. 20, the method includes following steps.

At step S101, an offset voltage in the reference voltage of the object quantizer is preliminarily corrected, so that the corrected offset voltage is stabilized within a preset offset grade.

At step S102, the corrected offset voltage is finely adjusted and calibrated to eliminate the offset voltage to obtain an accurate reference voltage of the object quantizer.

In the method, a program instruction may be preset to instruct a computer device to eliminate the offset voltage, and after the computer device receives the trigger of the program instruction, a corresponding operation is performed, that is, according to the preset program instructions, the offset voltage in the reference voltage of the object quantizer is preliminarily corrected to obtain the corrected offset voltage, so that the corrected offset voltage is stabilized within the preset offset grade. Then, the computer device may continue to execute the preset program instruction to finely adjust and calibrate the corrected offset voltage, so as to eliminate the offset voltage and obtain the precise reference voltage of the object quantizer.

It will be appreciated that the above process is implemented by computer program instructions provided into the processor of a general-purpose computer, special purpose computer, embedded processor, or other programmable data processing device, so that the instructions can be executed by the processor of the computer or other programmable data processing device to implement the offset voltage elimination in this embodiment. Of course, these computer program instructions may also be stored in a computer readable memory capable of directing a computer or other programmable data processing device to function in a particular manner, such that the instructions stored in the computer readable memory result in an article of manufacture comprising the instruction device. Alternatively, these computer program instructions can also be loaded on a computer or other programmable data processing device, such that a series of operational steps are performed on the computer or other programmable device to produce a computer-implementable processing. As such, the functions described above may be implemented by executing the computer program instructions on the computer or other programmable devices.

The principle and logic of implementing each step according to the program instruction in this embodiment may be the same as the principle and logic of the readout circuit of each of the above-mentioned embodiments, which will not be repeated in this embodiment of the present application. Of course, when the signal quantization is implemented in combination with the program instructions, the implementation can be modified as appropriate, which is not limited in the embodiments of the present application.

Figure 21:
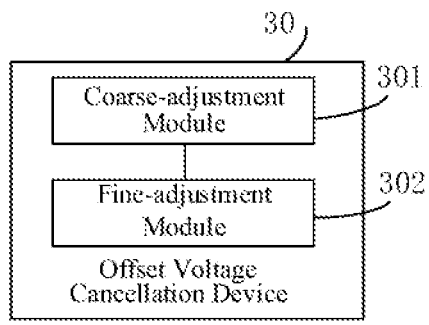
FIG. 21 is a schematic block diagram illustrating an offset voltage elimination device according to an embodiment of the present disclosure.

Based on the above-described offset voltage eliminating method, as shown in FIG. 21, an embodiment of the present disclosure further provides an offset voltage elimination device 30 including a coarse-adjustment module 301, and a fine-adjustment module 302.

The coarse-adjustment module 301 is configured to preliminary correct the offset voltage in the reference voltage of the object quantizer, to stabilize the corrected offset voltage within a preset offset grade.

The fine-adjustment module 302 is configured to finely adjust and calibrate the corrected offset voltage, to eliminate the offset voltage to obtain a precise reference voltage of the object quantizer.

The implementation principle and logic of each step in the above-mentioned offset voltage elimination device are the same as those in the embodiments of the offset voltage eliminating method, the offset voltage elimination circuit, and the readout circuit, for which, the foregoing description may be referred to, and details are omitted herein again.

In addition, embodiments of the present disclosure further provide a computer device including a memory and a processor. A computer program is stored on the memory, and when executing the computer program, the processor performs steps of any one of the offset voltage eliminating methods provided by the above embodiments.

An embodiment further provides a non-transitory computer-readable storage medium on which a computer program is stored, the computer program, when executed by a processor, causes the processor to perform the steps of any one of the offset voltage eliminating methods provided by the above embodiments.

In some embodiments, the present disclosure further provides a chip including the offset voltage elimination circuit or the readout circuit provided in any one of the above embodiments. In an implementation, the chip is a system on chip (SoC) and integrates a variety of functional devices. The chip may be connected to other relevant components via an external interface device. The other relevant components may be, for example, a camera, a display, a mouse, a keyboard, a network interface card, or a WIFI interface. In some application scenarios, other processing units (e.g., video codecs) and/or interface modules (e.g., DRAM interfaces), etc., may be integrated on the chip. In some embodiment, the present disclosure also provides a chip package structure including the chip described above. In some embodiment, the present disclosure also provides a board including the chip package structure described above.

From the foregoing description, it will be understood by those skilled in the art that the present disclosure also provides an electronic device or apparatus that may include one or more of the above-described boards.

According to different application scenarios, the electronic device or apparatus of the present disclosure may include a server, a cloud server, a server cluster, a data processing device, a robot, a computer, a printer, a scanner, a tablet computer, an intelligent terminal, a PC apparatus, an Internet of Things terminal, a mobile terminal, a mobile phone, a driving recorder, a navigator, a sensor, a monitor, a camera, a camcorder, a projector, a wristwatch, an earphone, a removable memory, a wearable apparatus, a visual terminal, an autopilot terminal, a vehicle, a home appliance, and/or a medical apparatus. The vehicle may include an aircraft, a ship, and/or an automobile. The home appliance may include a television, an air conditioner, a microwave oven, a refrigerator, a rice cooker, a humidifier, a washing machine, an electric lamp, a gas cooker, and a smoke exhauster. The medical apparatus may include a nuclear magnetic resonance instrument, a B-ultrasound instrument, and/or an electrocardiograph. The electronic device or apparatus of the present disclosure may also be applied to fields of Internet, Internet of Things, data center, energy, transportation, public administration, manufacturing, education, power grid, telecommunications, finance, retail, worksite, medical treatment, and the like. Further, the electronic device or apparatus of the present disclosure may also be used in application scenarios related to artificial intelligence, big data, and/or cloud computing such as a cloud, an edge, a terminal, and the like. In one or more embodiment, an electronic device or apparatus having high computational power according to the solution of the present disclosure may be applied to a cloud-side apparatus (e.g., a cloud server), and an electronic device or apparatus having a low power consumption may be applied to a terminal apparatus and/or an edge-side apparatus (e.g., a smartphone or a camera). In one or more embodiment, the hardware information of the cloud-side apparatus is compatible with the hardware information of the terminal apparatus and/or the edge-side apparatus, so that the hardware resources of the terminal apparatus and/or the edge-side apparatus can be simulated by suitable hardware sources matched from the hardware resources of the cloud device according to the hardware information of the terminal apparatus and/or the edge-side apparatus, to achieve the unified management, scheduling and collaborative work of terminal-cloud integration or cloud-edge-terminal integration.

In the present disclosure, the units described as separate parts may be physically separated or not, and the parts shown as units may be physical units or not. The components or units above may be located in the same location or distributed on a plurality of network units. In addition, some or all units may be selected to achieve the purposes of implementing the solutions described in the embodiments of the present disclosure according to actual requirements. In addition, in some scenarios, the plurality of units in the embodiments of the present disclosure may be integrated in one unit or be located in each physical unit separately.

In some implementation scenarios, the above integrated units described above may be implemented in the form of software program modules. If implemented in the form of a software program module and sold or used as a stand-alone product, the integrated unit may be stored in a computer-readable memory. Based on this, when the solutions of the present disclosure are embodied in the form of a software product, such as a computer-readable storage medium, the software product may be stored in a memory that may include a plurality of instructions, which enable a computer device, such as a personal computer, a server, or a network device, to perform some or all steps of the method described in the embodiments of the present disclosure. The foregoing memory may include, but is not limited to, a USB drive, a flash drive, a read-only memory (ROM), a random-access memory (RAM), a removable hard disk, a magnetic disk, an optical disc, or any other medium capable of storing program codes.

In other implementation scenarios, the integrated units described above may also be implemented in the form of hardware, that is, specific hardware circuits, which may include digital circuits and/or analog circuits. A physical implementation of a hardware structure of a circuit may include, but is not limited to, a physical device, which may include, but is not limited to, a transistor, a memristor, or the like. In view of this, various devices described herein, such as computing devices or other processing devices, may be implemented by a suitable hardware processor, such as a CPU, GPU, FPGA, DSP, ASIC, and the like. Further, the aforementioned storage unit or storage device may be any suitable storage medium (including a magnetic storage medium, a magneto-optical storage medium, or the like), which may be, for example, RRAM (Resistive Random Access Memory), DRAM (Dynamic Random Access Memory), SRAM (Static Random Access Memory), EDRAM (Enhanced Dynamic Random Access Memory), HBM (High Bandwidth Memory), HMC (Hybrid Memory Cube), ROM and RAM, or the like.

While multiple embodiments of the present disclosure have been illustrated and described herein, it will be apparent to those skilled in the art that such embodiments are provided by way of example only. Many modifications, changes, and replacements may be made by those skilled in the art without departing from the ideas and spirit of the present disclosure. It should be understood that various alternatives to an embodiment according to the present disclosure described herein may be used in the practice of the present disclosure. The appended claims are intended to define the scope of the present disclosure and thus cover equivalents or alternatives within the scope of these claims.

In the above-mentioned embodiments, the description of each embodiment has its emphasis. For parts that are not described in detail in a certain embodiment, reference may be made to the relevant descriptions of other embodiments. The technical features of the above embodiments may be combined arbitrarily. For the sake of brevity, not all possible combinations of the technical features in the above embodiments are described. However, as long as there is no obvious contradiction in the combination of these technical features, such a combination should be considered to be within the scope described in this specification.

The above embodiments of the present disclosure are described in detail as above, and the principles and implementations of the present disclosure are described by means of specific examples. The illustrations of the above embodiments are merely intended to help understand the method and core ideas of the present disclosure. What's more, changes, or modifications, made by those skilled in the art based on the specific embodiments and application scopes of the present disclosure, all fall within the scope of the present disclosure. In summary, the contents of this specification should not be construed as a limitation to this disclosure.

What is claimed is:

1. A readout circuit, comprising an object quantizer and an offset voltage elimination circuit, wherein the offset voltage elimination circuit comprises:
    a correction circuit, an input of the correction circuit being connected to an output of the object quantizer;
    a calibration circuit, a compensation input of the calibration circuit being connected to an output of the correction circuit, and a reference input of the calibration circuit being connected to the output of the object quantizer; and
    an offset voltage generating device, wherein a reference input of the offset voltage generating device is connected to a reference voltage terminal, and an output of the offset voltage generating device is connected to an input of the object quantizer.

2. The readout circuit according to claim 1, wherein:
    the offset voltage generating device comprises an amplifier and a buffer;
    an input of the buffer is connected to the reference voltage terminal, an output of the buffer is connected to an input of the amplifier, and an output of the amplifier is connected to the input of the object quantizer.

3. The readout circuit according to claim 2, wherein:
    the correction circuit comprises a comparator, an analog-to-digital converter, and a current compensator;
    the comparator is configured to process a voltage signal converted from the offset voltage to obtain a level signal; and
    an input of the analog-to-digital converter is connected to an output of the comparator, and an output of the analog-to-digital converter is connected to an input of the current compensator; and
    an output of the current compensator is connected to the compensation input of the calibration circuit.

4. The readout circuit according to claim 3, wherein:
    the analog-to-digital converter comprises a first analog-to-digital converter and a second analog-to-digital converter, and the current compensator comprises a first current compensator and a second current compensator;
    the compensation input of the calibration circuit comprises a first input and a second input, and the output of the calibration circuit includes a first output and a second output;
    the output of the comparator is connected to an input of the first analog-to-digital converter; an output of the first analog-to-digital converter is connected to an input of the first current compensator; and an output of the first current compensator is connected to the first input of the calibration circuit, and the first output of the calibration circuit is connected to an input of the buffer;
    the output of the comparator is connected to an input of the second analog-to-digital converter; an output of the second analog-to-digital converter is connected to an input of the second current compensator; and an output of the second current compensator is connected to the second input of the calibration circuit, and the second output of the calibration circuit is connected to an input of the amplifier.

5. The readout circuit according to claim 4, wherein:
    the correction circuit further comprises a first phase switch and a second phase switch;
    the comparator and the first analog-to-digital converter are connected by the first phase switch; and
    the comparator and the second analog-to-digital converter are connected by the second phase switch.

6. The readout circuit according to claim 4, wherein:
the correction circuit further comprises a bidirectional offset voltage control circuit, and the bidirectional offset voltage control circuit comprises a first bidirectional offset voltage control circuit and a second bidirectional offset voltage control circuit;
an input of the first bidirectional offset voltage control circuit is connected to the output of the first current compensator, an output of the first bidirectional offset voltage control circuit is connected to the first input of the calibration circuit; and
an input of the second bidirectional offset voltage control circuit is connected to the output of the second current compensator, and an output of the second bidirectional offset voltage control circuit is connected to the second input of the calibration circuit.

7. The readout circuit according to claim 4, wherein:
the calibration circuit comprises a first phase calibration circuit and a second phase calibration circuit, and the first phase calibration circuit and the second phase calibration circuit are configured to adjust and calibrate offset voltages at different phases, respectively.

8. The readout circuit according to claim 7, wherein:
the first phase calibration circuit comprises a first voltage-current converter, and the second phase calibration circuit comprises a second voltage-current converter;
the amplifier is configured to, at a first phase, convert an offset voltage generated by the buffer into a first offset current, or configured to, at a second phase, make the input of the amplifier short-circuit and convert an offset voltage generated by the amplifier into a second offset current;
the object quantizer is configured to integrate the first offset current to obtain a corresponding first voltage signal, or to integrate the second offset current to obtain a corresponding second voltage signal;
the first voltage-current converter is configured to generate a first fine-adjustment compensation current according to the first voltage signal, the first fine-adjustment compensation current is configured to compensate for the buffer; and
the second voltage-current converter is configured to generate a second fine-adjustment compensation current according to the second voltage signal, and the second fine-adjustment compensation current is configured to compensate for the amplifier.

9. The readout circuit according to claim 8, wherein:
an input of the first voltage-current converter is connected to the output of the object quantizer, an output of the first voltage-current converter is connected to the buffer;

an input of the second voltage-current converter is connected to the output of the object quantizer, and an output of the second voltage-current converter is connected to the amplifier.

10. The readout circuit according to claim 3, wherein:
the correction circuit further comprises a bidirectional offset voltage control circuit; and
an input of the bidirectional offset voltage control circuit is connected to the output of the current compensator, and an output of the bidirectional offset voltage control circuit is connected to the compensation input of the calibration circuit.

11. The readout circuit according to claim 10, wherein:
the current compensator is configured to provide compensation currents for the buffer and the amplifier, respectively; and
the bidirectional offset voltage control circuit is configured to control the compensation currents to flow to the buffer and to the amplifier at different phases.

12. The readout circuit according to claim 1, wherein an output of the calibration circuit is connected to the offset voltage generating device.

13. A readout circuit comprising, comprising
a coarse quantizer, configured to coarsely quantize an analog signal of an object apparatus to obtain a first quantized signal, a reference voltage of the coarse quantizer being a voltage obtained by an offset voltage elimination circuit conducting an offset voltage elimination processing, and the offset voltage elimination process comprising preliminarily correcting the offset voltage in the reference voltage of the coarse quantizer to stabilize a corrected offset voltage within a preset offset grade, and finely adjusting and calibrating the corrected offset voltage;
a sample-and-hold circuit, configured to conduct a sample-and-hold processing on the first quantized signal; and
a fine quantizer, configured to finely quantize a sampled and held first quantized signal to obtain a quantized value corresponding to the analog signal.

14. The readout circuit according to claim 13, wherein the coarse quantizer is an integrator, and the fine quantizer is an analog-to-digital converter.

15. The readout circuit according to claim 13, comprising a plurality of coarse quantizers, wherein the plurality of coarse quantizers correspond to one fine quantizer.

* * * * *